(12) United States Patent
Wu et al.

(10) Patent No.: US 11,894,423 B2
(45) Date of Patent: Feb. 6, 2024

(54) CONTACT RESISTANCE REDUCTION IN NANOSHEET DEVICE STRUCTURE

(71) Applicant: International Business Machines Corporation, Armonk, NY (US)

(72) Inventors: Heng Wu, Santa Clara, CA (US);
Dechao Guo, Niskayuna, NY (US);
Ruqiang Bao, Niskayuna, NY (US);
Junli Wang, Slingerlands, NY (US);
Lan Yu, Voorheesville, NY (US);
Reinaldo Vega, Mahopac, NY (US);
Adra Carr, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/677,007

(22) Filed: Feb. 22, 2022

(65) Prior Publication Data

US 2022/0181439 A1    Jun. 9, 2022

Related U.S. Application Data

(62) Division of application No. 16/290,611, filed on Mar. 1, 2019, now Pat. No. 11,289,573.

(51) Int. Cl.
*H01L 29/06* (2006.01)
*H01L 21/02* (2006.01)
(Continued)

(52) U.S. Cl.
CPC ............ *H01L 29/0673* (2013.01); *H01L 21/02532* (2013.01); *H01L 21/02603* (2013.01);
(Continued)

(58) Field of Classification Search
CPC ..... H01L 21/823437; H01L 21/823431; H01L 27/0886; H01L 29/66545; H01L 29/6681;
(Continued)

(56) References Cited

U.S. PATENT DOCUMENTS 9,166,025 B1   10/2015   Pawlak
9,214,553 B2   12/2015   Cai et al.
(Continued)

FOREIGN PATENT DOCUMENTS

KR        100558037 B1    3/2006

OTHER PUBLICATIONS

Disclosed Anonymously, "Segmented Stacked FinFET for Improved Contact Resistance," ip.com, IPCOM000242086D, Jun. 18, 2015, 2 pages.
List of IBM Patents or Patent Applications Treated as Related.

*Primary Examiner* — Latanya N Crawford Eason
(74) *Attorney, Agent, or Firm* — Kimberly Zillig; Ryan, Mason & Lewis, LLP

(57) ABSTRACT

Techniques are provided to fabricate semiconductor devices having a nanosheet field-effect transistor device disposed on a semiconductor substrate. The nanosheet field-effect transistor device includes a nanosheet stack structure including a semiconductor channel layer and a source/drain region in contact with an end portion of the semiconductor channel layer of the nanosheet stack structure. A trench formed in the source/drain region is filled with a metal-based material. The metal-based material filling the trench in the source/drain region mitigates the effect of source/drain material overfill on the contact resistance of the semiconductor device.

20 Claims, 15 Drawing Sheets

(51) Int. Cl.
*H01L 29/66* (2006.01)
*H01L 29/78* (2006.01)
*H01L 29/165* (2006.01)
*H01L 27/088* (2006.01)
*H01L 21/8234* (2006.01)
*H01L 29/08* (2006.01)

(52) U.S. Cl.
CPC ........ *H01L 21/823412* (2013.01); *H01L 21/823418* (2013.01); *H01L 21/823431* (2013.01); *H01L 21/823437* (2013.01); *H01L 21/823468* (2013.01); *H01L 27/0886* (2013.01); *H01L 29/0847* (2013.01); *H01L 29/165* (2013.01); *H01L 29/6656* (2013.01); *H01L 29/6681* (2013.01); *H01L 29/66545* (2013.01); *H01L 29/66553* (2013.01); *H01L 29/7851* (2013.01)

(58) Field of Classification Search
CPC ........ H01L 29/0847; H01L 23/823412; H01L 21/823468; H01L 29/66553; H01L 29/6656; H01L 21/823418; H01L 29/0653; H01L 29/0673; H01L 21/02532; H01L 21/02603; H01L 29/165; H01L 29/7851
See application file for complete search history.

(56) References Cited

U.S. PATENT DOCUMENTS

| | | | |
|---|---|---|---|
| 9,461,149 | B2 | 10/2016 | Li et al. |
| 9,716,143 | B2 | 7/2017 | Yang et al. |
| 9,837,414 | B1 | 12/2017 | Balakrishnan et al. |
| 9,847,390 | B1 | 12/2017 | Xie et al. |
| 9,881,926 | B1 | 1/2018 | Basker et al. |
| 9,947,804 | B1 | 4/2018 | Frougier et al. |
| 10,032,867 | B1 | 7/2018 | Yeung et al. |
| 10,236,217 | B1 | 3/2019 | Ando et al. |
| 10,263,100 | B1 | 4/2019 | Bi et al. |
| 10,361,131 | B2 | 7/2019 | Ando et al. |
| 10,361,269 | B2 | 7/2019 | Yeung et al. |
| 10,522,419 | B2 | 12/2019 | Ando et al. |
| 10,896,956 | B2 * | 1/2021 | Coquand ............... H01L 29/775 |
| 2016/0126310 | A1 | 5/2016 | Rodder et al. |
| 2017/0236900 | A1 * | 8/2017 | Chang ................... H01L 29/775 438/157 |
| 2017/0271475 | A1 * | 9/2017 | Chang ................ H01L 21/0223 |
| 2018/0090582 | A1 | 3/2018 | Adusumilli et al. |
| 2019/0131395 | A1 * | 5/2019 | Lee ..................... H01L 29/0653 |
| 2019/0148515 | A1 | 5/2019 | Cheng et al. |
| 2020/0066894 | A1 * | 2/2020 | Frougier ............ H01L 29/0847 |
| 2020/0083352 | A1 | 3/2020 | Chanemougame et al. |
| 2020/0126987 | A1 * | 4/2020 | Rubin ................ H01L 29/0847 |

* cited by examiner

100

CONTACT RESISTANCE REDUCTION IN NANOSHEET DEVICE STRUCTURE

BACKGROUND

Continued innovations in semiconductor process technologies are enabling higher integration densities and device scaling. As the semiconductor industry moves towards the 7-nm technology node and beyond, semiconductor FET device structures must be scaled to smaller dimensions to provide increased device width per footprint area. In this regard, non-planar FET devices such as nanosheet FET devices, nanowire FET devices, vertical FET devices, FinFET devices, etc., are a viable option for continued CMOS scaling. In general, a nanowire FET device comprises a device channel which comprises one or more nanowire layers in a stacked configuration, wherein each nanowire comprises an elongated semiconductor layer that has a width which is substantially the same or slightly larger than a thickness of the elongated semiconductor layer. A nanosheet FET device is similar to a nanowire FET device sheet in that a device channel comprises one or more nanosheet layers in a stacked configuration, but wherein each nanosheet layer has a width which is substantially greater than a thickness of the nanosheet layer. In nanowire/nanosheet FET devices, a common gate structure is formed above and below each nanowire/nanosheet layer in the stacked configuration, thereby increasing the FET device width (or channel width), and thus the drive current, for a given footprint area.

SUMMARY

Embodiments of the invention include techniques for fabricating semiconductor integrated circuit devices comprising nanosheet field-effect transistor devices having trenches in the source/drain regions filled with source/drain contact material.

For example, one embodiment includes a method for fabricating a semiconductor device, which comprises forming a nanosheet stack structure on a semiconductor substrate. The nanosheet stack structure comprises a semiconductor channel layer. A source/drain region is formed in contact with an end portion of the semiconductor channel layer of the nanosheet stack structure. A sacrificial layer is formed over the source/drain region. A trench is etched in the source/drain region through at least a portion of the sacrificial layer and the trench is filled with a metal-based material.

Another embodiment includes a method for fabricating a semiconductor device, which comprises forming a nanosheet stack structure on a semiconductor substrate. The nanosheet stack structure comprises a stack of alternating semiconductor layers which comprises sacrificial nanosheet layers and nanosheet channel layers. Each nanosheet channel layer is disposed between sacrificial nanosheet layers in the nanosheet stack structure. A dummy gate is formed over the nanosheet stack structure to define a gate region and a gate sidewall spacer is formed surrounding the dummy gate. A source/drain region is formed in contact with end portions of the nanosheet channel layers of the nanosheet stack structure and a sacrificial layer is formed over the source/drain region and the gate region. A trench is etched in the source/drain region through at least a portion of the sacrificial layer and filled with a metal-based material.

Another embodiment includes a semiconductor integrated circuit device, which comprises a nanosheet field-effect transistor device disposed on a semiconductor substrate. The nanosheet field-effect transistor device comprises a nanosheet stack structure comprising a semiconductor channel layer and a source/drain region in contact with an end portion of the semiconductor channel layer of the nanosheet stack structure. A trench in the source/drain region is filled with a metal-based material.

Other embodiments will be described in the following detailed description of embodiments, which is to be read in conjunction with the accompanying figures.

DETAILED DESCRIPTION

Figure 1:
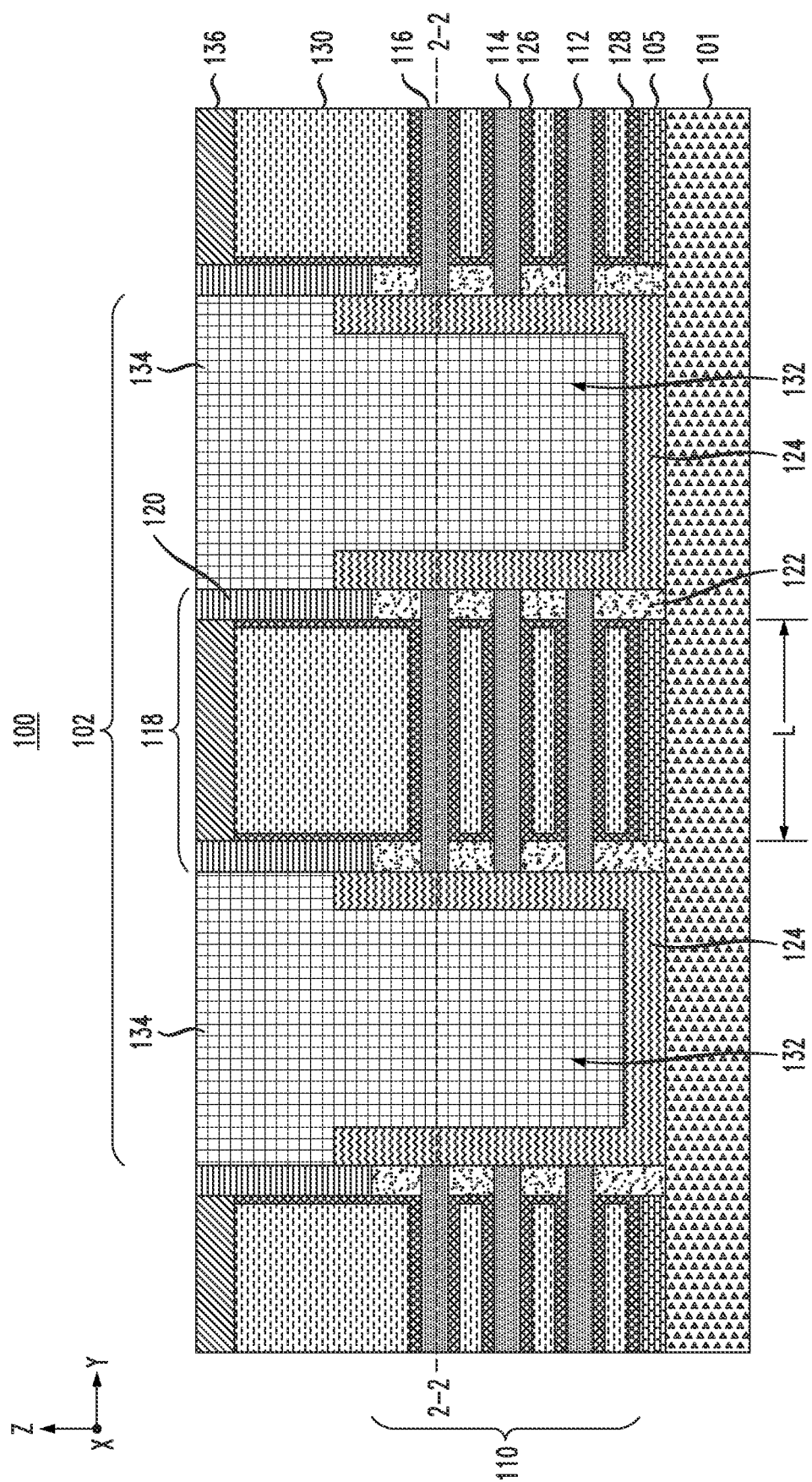
FIG. 1 is a schematic cross-sectional side view of a semiconductor integrated circuit device comprising a nanosheet FET device having a channel in a source/drain region filled with source/drain contact material, according to an embodiment of the invention.

Embodiments of the invention will now be described in further detail below. Devices and methods are provided to fabricate nanosheet field-effect transistor devices having reduced contact resistance, for example, by forming contact material in a channel formed in the source/drain regions.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor device structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

To provide spatial context to the different structural orientations of the semiconductor device structures shown throughout the drawings, XYZ Cartesian coordinates are shown in each of the drawings. The terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or a Y-direction of the Cartesian coordinates shown in the drawings.

Figure 2:
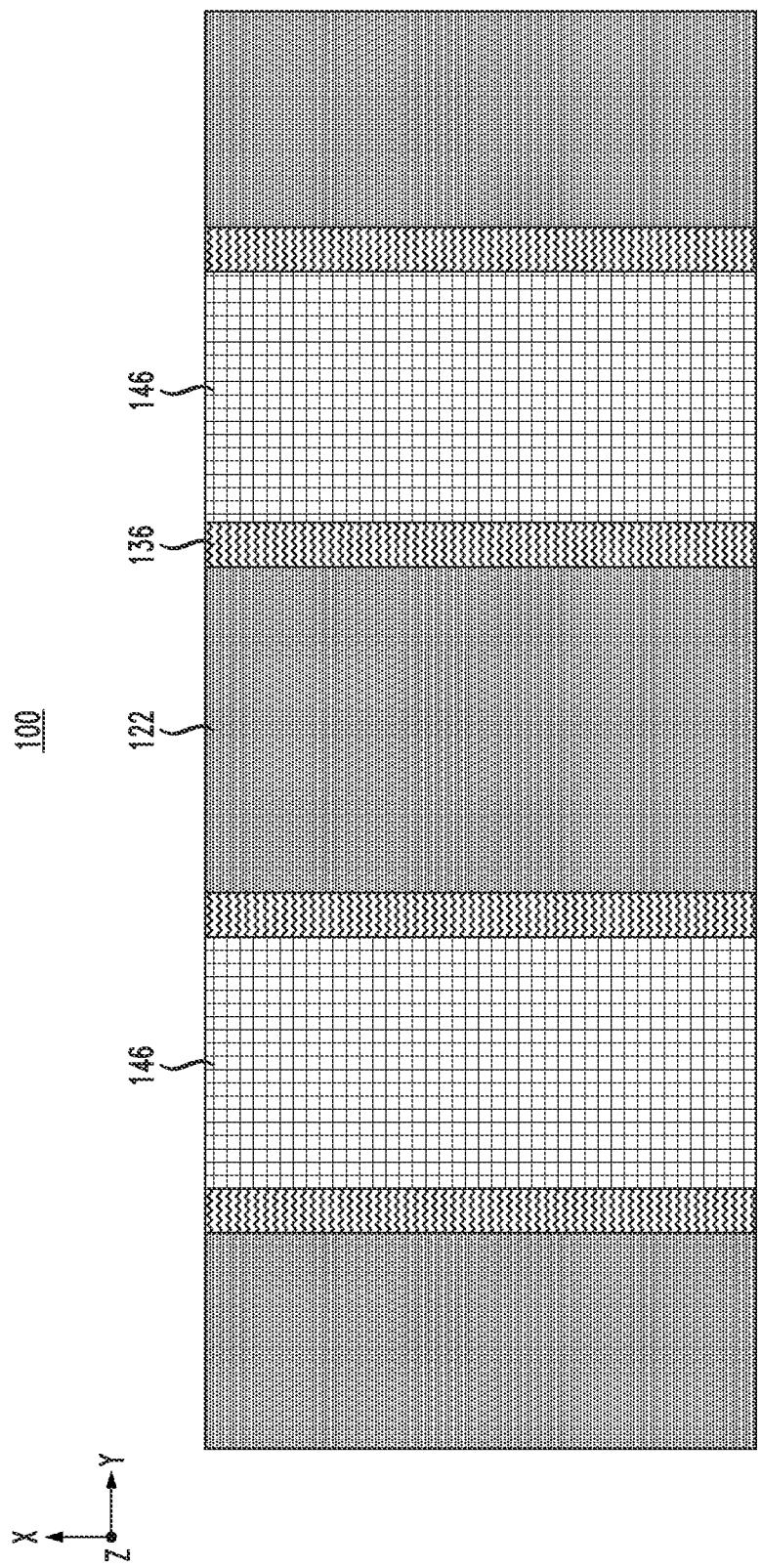
FIG. 2 is a schematic cross-sectional side view of the semiconductor integrated circuit device of FIG. 1 along line 2-2 of FIG. 1.

FIGS. 1 and 2 are schematic views of a semiconductor integrated circuit device 100 comprising a nanosheet FET device 102 having source/drain contact material 134 formed in trenches 132 of the source/drain regions 124 that reduces contact resistance in the semiconductor integrated circuit device 100. FIG. 1 is a schematic cross-sectional side view (Z-Y plane) of the semiconductor integrated circuit device 100, and FIG. 2 is a schematic cross-sectional side view (X-Y plane) of the semiconductor integrated circuit device 100 along line 2-2 of FIG. 1. As illustrated in FIGS. 1 and 2, the semiconductor integrated circuit device 100 comprises a semiconductor substrate 101 and the nanosheet FET device 102. In some embodiments semiconductor integrated circuit device 100 comprises an oxide layer 105 disposed between the semiconductor substrate 101 and the nanosheet FET device 102 which may, for example, provide etch selectivity between the layers of nanosheet FET device 102 and the semiconductor substrate 101.

The nanosheet FET device 102 comprises a nanosheet stack structure 110 comprising a plurality of nanosheet channel layers 112, 114, and 116. In one embodiment, the nanosheet channel layers 112, 114, and 116 are formed of epitaxial semiconductor material such as epitaxial silicon. The nanosheet FET device 102 comprises a gate structure 118 covering the nanosheet stack structure 110. The gate structure 118 comprises a gate sidewall spacer 120 and inner sidewall spacers 122 which define a gate region of the gate structure, wherein high-k gate dielectric/metal gate (HKMG) structures are formed within the gate region defined by the sidewall spacers 120 and 122 of the gate structure 118.

The nanosheet FET device 102 comprises epitaxial source/drain regions 124 which are connected to end portions of the nanosheet channel layers 112, 114, 116 along a channel length L of the nanosheet FET device 102 (wherein the channel length L is defined by the distance between the inner surfaces of the inner sidewall spacers 122, as schematically illustrated in FIG. 1). In one embodiment, the source/drain regions 124 comprise merged epitaxial semiconductor layers that are epitaxially grown on the end portions of the nanosheet channel layers 112, 114, 116. In some embodiments the source/drain regions 124 may also be epitaxially grown on the semiconductor substrate 101. It is to be understood that the term "source/drain region" as used herein means that a given source/drain region can be either a source region or a drain region, depending on the application or circuit configuration.

In the exemplary embodiment shown in FIGS. 1 and 2, the HKMG structure of the gate structure 118 comprises a thin interfacial silicon oxide layer 126 formed on the epitaxial silicon surfaces of the nanosheet channel layers 112, 114, and 116 and an oxide layer 105 formed on the portion of the semiconductor substrate 101 exposed within the gate region of the gate structure 118. The HKMG structure of the gate structure 118 also comprises conformal layers of high-k gate dielectric material 128 disposed on the interfacial silicon oxide layers 126 and oxide layer 105, and a layer of work function metal 130 which fills the gate region including the spaces above and below the nanosheet channel layers 112, 114, and 116. A gate cap dielectric layer 136 is formed on an upper surface of the gate structure 118. The gate sidewall spacers 120 and gate cap dielectric layer 136 electrically insulate the gate structure 118 from the surrounding elements (e.g., source/drain regions 124 and source/drain contact material 134, etc.).

In the exemplary embodiment of FIGS. 1 and 2, the nanosheet FET device 102 is designed to have a threshold voltages (Vt) which is tuned to a target value by the metallic composition and/or layer of work function metal 130. For example, the work function metal 130 may comprise titanium nitride (TiN), titanium aluminum carbide (TiAlC) (or a multilayer WFM stack comprising, e.g., a thin layer of TiAlC disposed between thin TiN layers.)

In the exemplary embodiment of FIGS. 1 and 2, trenches 132 are formed in the epitaxial source/drain regions 124 such that when a source/drain contact material 134 is formed on the epitaxial source/drain regions 124, the source/drain contact material 134 is also formed in the trenches 132. By forming the trenches 132 in the epitaxial source/drain regions 124, and by forming the source/drain contact material 134 in the trenches 132, the effect of variations in the height or thickness of the source/drain regions 124 on the contact resistance of the nanosheet FET device 102 due to semiconductor fabrication processes may be reduced. For example, in some cases the epitaxial growth of the source/drain regions 124 may result in an overfill, e.g., growth beyond a desired level. In such a case, a contact resistance of the nanosheet FET device 102 may be higher than a desired level, e.g., due to the extra height or thickness of the source/drain material in the source/drain regions 124 causing increased resistance between the nanosheet channel layers 112, 114, and 116, and the source/drain contact material 134. The formation of the trenches 132 in the source/drain regions 124 ensures that the source/drain regions 124 have a uniform and repeatable thickness between the nanosheet channel layers 112, 114, and 116, and the source/drain contact material 134, e.g., the portion of the source/drain contact material 134 that is contained in the trenches 132. The use of trenches 132 containing the source/drain contact material 134 ensures that a nanosheet FET device 102 that has an overfill of the source/drain regions 124 during epitaxial growth and a nanosheet FET device 102 that does not have an overfill of the source/drain regions 124 during epitaxial growth will have about the same or similar contact resistance between the nanosheet channel layers 112, 114, and 116, and the source/drain contact material 134.

Figure 3:
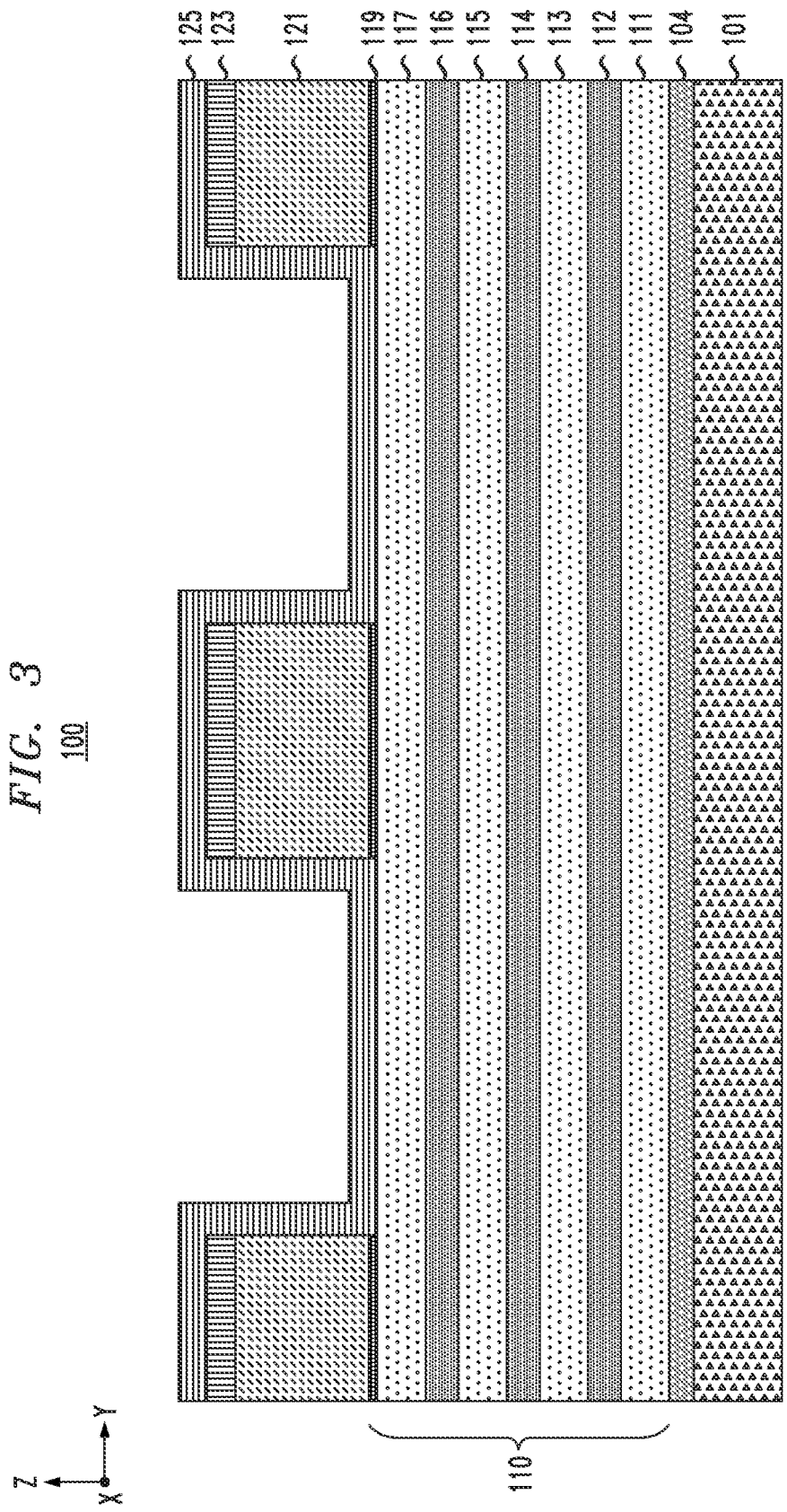
FIG. 3 is a schematic cross-sectional side view of a semiconductor device structure at an intermediate stage of fabrication comprising a semiconductor substrate and a nanosheet stack structure formed on the semiconductor substrate, according to an embodiment of the invention.

FIGS. 3-11 schematically illustrate a method for fabricating a semiconductor integrated circuit device comprising a nanosheet FET device having source/drain regions with channels containing contact material, according to an embodiment of the invention. For illustrative purposes, FIGS. 3-11 illustrate a process for fabricating the semiconductor integrated circuit device 100 of FIGS. 1 and 2. To begin, FIG. 3 is a schematic cross-sectional side view (Z-Y plane) of the semiconductor device 100 at an intermediate stage of fabrication comprising a semiconductor substrate 101, a spacer layer 104, and a nanosheet stack structure 110 formed on the spacer layer 104. The nanosheet stack structure 110 comprises a stack of alternating semiconductor layers 111-117. While the semiconductor substrate 101 is illustrated as a generic substrate layer, it is to be understood that the semiconductor substrate 101 may comprise one of different types of semiconductor substrate structures and materials.

For example, in one embodiment, the semiconductor substrate 101 can be a bulk semiconductor substrate (e.g., wafer) that is formed of silicon (Si) or germanium (Ge), or other types of semiconductor substrate materials that are commonly used in bulk semiconductor fabrication processes such as a silicon-germanium alloy, compound semiconductor materials (e.g. III-V), etc. In another embodiment, the semiconductor substrate 101 may be an active semiconductor layer of an SOI (silicon-on-insulator) substrate, GeOI (germanium-on-insulator) substrate, or other type of semiconductor-on-insulator substrate, which comprises an insulating layer (e.g., oxide layer) disposed between a base substrate layer (e.g., silicon substrate) and the active semiconductor layer (e.g., Si, Ge, etc.) in which active circuit components are formed as part of a front-end-of-line (FEOL) structure. It is to be noted that in each drawing, the Z-Y plane represents a plane that is parallel to the plane of the semiconductor substrate 101 (e.g., wafer) being processed.

The stack of alternating semiconductor layers 111-117 of the nanosheet stack structure 110 comprises sacrificial nanosheet layers 111, 113, 115, and 117 and nanosheet channel layers 112, 114, and 116. Each nanosheet channel layer 112, 114, and 116 is disposed between sacrificial nanosheet layers in the nanosheet stack structure 110. The stack of alternating semiconductor layers 111-117 comprises epitaxial semiconductor layers that are sequentially grown. For example, the sacrificial nanosheet layer 111 is epitaxially grown on a surface of the spacer layer 104, the nanosheet channel layer 112 is epitaxially grown on the sacrificial nanosheet layer 111, the sacrificial nanosheet layer 113 is epitaxially grown on the nanosheet channel layer 112, the nanosheet channel layer 114 is epitaxially grown on the sacrificial nanosheet layer 113, the sacrificial nanosheet layer 115 is epitaxially grown on the nanosheet channel layer 114, the nanosheet channel layer 116 is epitaxially grown on the sacrificial nanosheet layer 115, and the sacrificial nanosheet layer 117 is epitaxially grown on the nanosheet channel layer 116.

In one embodiment, the epitaxial semiconductor layers 111-117 comprise single crystal (monocrystalline) semiconductor materials, which are epitaxially grown using known methods such as chemical vapor deposition (CVD), metal-organic chemical vapor deposition (MOCVD), low pressure chemical vapor deposition (LPCVD), molecular beam epitaxy (MBE), vapor-phase epitaxy (VPE), liquid-phase epitaxy (LPE), metal organic molecular beam epitaxy (MOMBE), rapid thermal chemical vapor deposition (RT-CVD), low-energy plasma deposition (LEPD), ultra-high vacuum chemical vapor deposition (UHVCVD), atmospheric pressure chemical vapor deposition (APCVD), liquid-phase epitaxy (LPE), metal-organic chemical vapor deposition (MOCVD), or other known epitaxial growth techniques which are suitable for the given process flow. The types of materials that are utilized to form the epitaxial semiconductor layers 111-117 will depend on various factors such as the type of nanosheet FET device (p-type, or n-type), and the desired level of etch selectivity between the semiconductor layers, as well as providing sufficient lattice matching between the materials of the semiconductor layers to ensure proper (e.g., defect-free) epitaxial growth of the crystalline semiconductor layers 111-117.

For example, in one embodiment, the nanosheet channel layers 112, 114, and 116 are formed of epitaxial silicon (Si), which is suitable to serve as semiconductor channel layers for a nanosheet FET device. When the nanosheet channel layers 112, 114, and 116 are formed of crystalline Si, the sacrificial nanosheet layers 111, 113, 115, and 117, which serve as sacrificial layers that are subsequently etched away to release the nanosheet channel layers 112, 114, and 116, can be formed of an epitaxial silicon-germanium (SiGe) alloy. This allows the epitaxial SiGe material of the sacrificial nanosheet layers 111, 113, 115, and 117 to be etched selective to the epitaxial Si material of the nanosheet channel layers 112, 114, and 116 in a subsequent process step to "release" the nanosheet channel layers 112, 114, and 116.

In other embodiments, the nanosheet channel layers 112, 114, and 116 can be formed of an epitaxial SiGe material with a desired Ge concentration (optimized for device performance), and the sacrificial nanosheet layers 111, 113, 115, and 117 can be formed of a sacrificial semiconductor material (e.g., Si) that can be etched selective to the nanosheet channel layers 112, 114, and 116. While the nanosheet stack of epitaxial semiconductor layers 110 is shown to include three nanosheet channel layers 112, 114, and 116, in other embodiments of the invention, the nanosheet stack 110 can be fabricated with more or less than three nanosheet channel layers.

In some embodiments, spacer layer 104 may also be formed of an epitaxial silicon-germanium (SiGe) alloy. In some embodiments, the spacer layer 104 may comprise a SiGe alloy having a high percentage of Ge while nanosheet channel layers 112, 114, and 116 may comprise a SiGe alloy having a lower percentage of Ge than space layer 104, such that spacer layer 104 is selectively etchable relative to nanosheet channel layers 112, 114, and 116. For example, in some embodiments, spacer layer 104 may comprise a SiGe alloy having a range of about 50% to about 90% Ge and nanosheet channel layers 112, 114, and 116 may comprise a SiGe alloy having a range of about 10% to about 30% Ge. In some embodiments, spacer layer 104 is also selectively etchable relative to sacrificial nanosheet layers 111, 113, 115, and 117.

With continued reference to FIG. 3, the sacrificial nanosheet layers 111, 113, 115, and 117 may be formed with a thickness that defines the spacing size above and below the nanosheet channel layers 112, 114, and 116, in which high-k dielectric material and work function metal is formed. The size of the spacing and the type of WFM material(s) disposed in the spaces above and below the nanosheet channel layers 112, 114, and 116 defines, in part, the threshold voltage (Vt) of the nanosheet FET device. In one embodiment, the thickness of the sacrificial nanosheet layers 111, 113, 115, and 117 is in a range of about 8 nm to about 15 nm.

The thickness of the nanosheet channel layers 112, 114, and 116 defines, in part, the threshold voltage (Vt) of the nanosheet FET device (e.g., Vt increases with decreasing channel thickness). In one embodiment, the thickness of the nanosheet channel layers 112, 114, and 116 is in a range of about 6 nm to about 8 nm, although the nanosheet channel layers 112, 114, and 116 can be formed with other thickness ranges, depending on the application.

With continued reference to FIG. 3, at the intermediate stage of fabrication, a dummy gate structure has been formed over the nanosheet stack structure 110 which includes a dummy gate oxide layer 119, a dummy gate electrode layer 121 (e.g., sacrificial polysilicon or amorphous silicon material), and a gate capping layer 123. The dummy gate oxide layer 119 and the dummy gate electrode layer 121 of the dummy gate structure comprise sacrificial material which is subsequently removed as part of a replacement metal gate process and replaced with a high-k gate dielectric material and metallic material to form high-k metal gate structures. The semiconductor device structure shown in FIG. 3 is fabricated using known methods.

For example, starting with the semiconductor substrate 102, spacer layer 104, and nanosheet stack structure 110 of FIG. 3, a thin conformal layer of silicon oxide is deposited over the entire surface of the semiconductor device structure covering the upper surface of the nanosheet stack structure 110, followed by a blanket deposition of a sacrificial material such as polysilicon or amorphous silicon material over the conformal layer of silicon oxide to cover the nanosheet stack structure 110. A chemical mechanical polishing (CMP) process is then performed to planarize the layer of sacrificial material, and a hard mask layer is formed on the planarized surface of the polysilicon layer by depositing a layer of dielectric material such as silicon nitride (SiN), silicon carbon nitride (SiCN), silicon oxynitride (SiON), boron nitride (BN), silicon boron nitride (SiBN), siliconborocarbonitride (SiBCN), silicon oxycarbonitride (SiOCN), or other similar materials commonly used to form gate capping layers and gate sidewall spacers.

The hard mask layer is then patterned to form the gate capping layer 123, which defines an image of the dummy gate structure. The gate capping layer 123 is then utilized as an etch hardmask to anisotropically etch (e.g., RIE) the sacrificial polysilicon and oxide layers to thereby form the dummy gate oxide layer 119 and the dummy gate electrode 121 of the gate structure 118 of FIG. 1. The gate sidewall spacers 120 are then formed by depositing a conformal layer of dielectric material 125 over the entire surface of the semiconductor device structure. The conformal layer of dielectric material 125 can be formed of SiN, SiCN, SiON, BN, SiBN, SiBCN, SiOCN, or any other type of dielectric material that is commonly used to form insulating gate sidewall spacers of FET devices, and deposited using known techniques such as atomic layer deposition (ALD), CVD and PVD.

Figure 4:
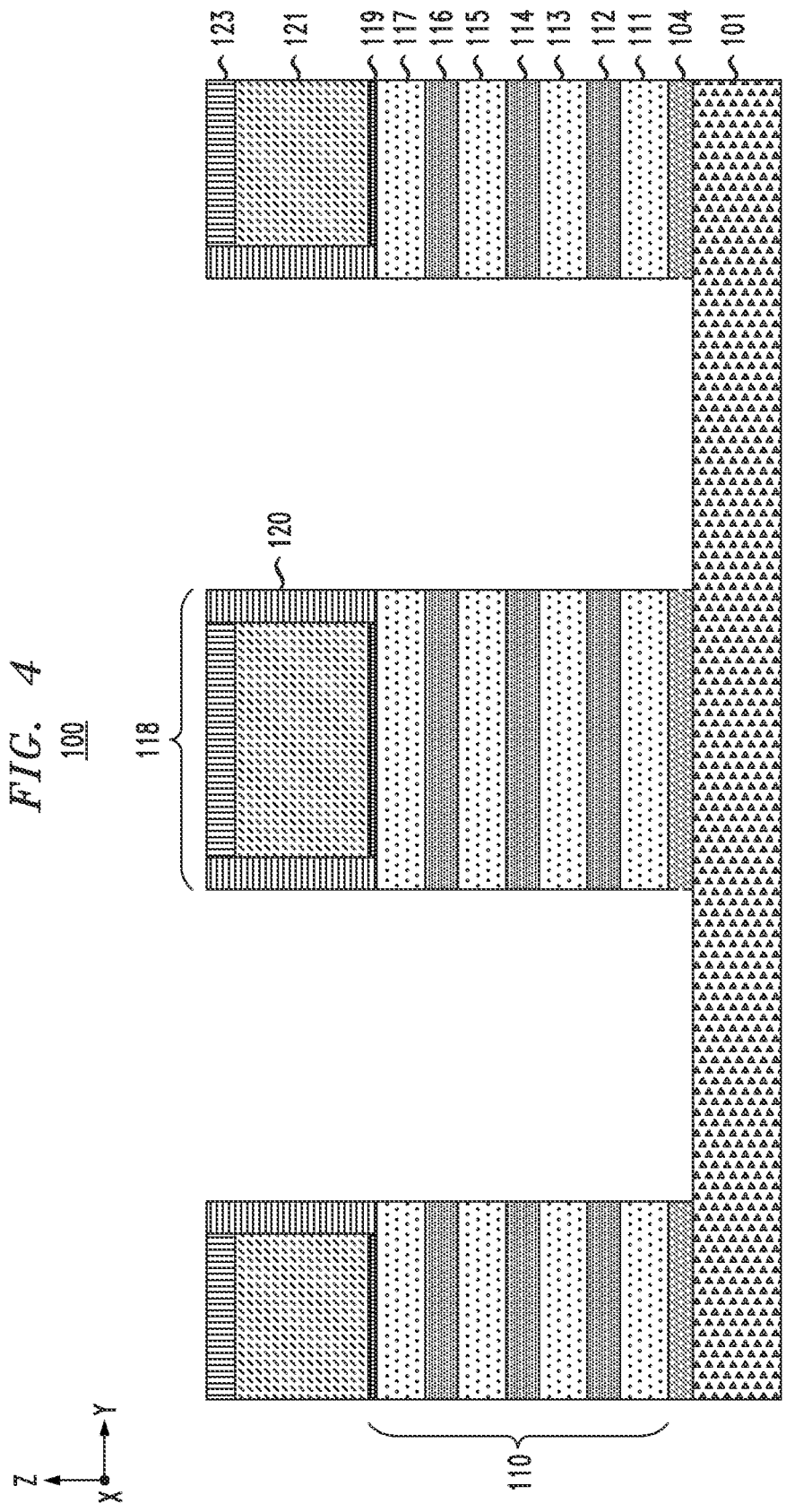
FIG. 4 is a schematic cross-sectional side view of the semiconductor device structure of FIG. 3 after formation of gate sidewall spacers, according to an embodiment of the invention.

The conformal layer of dielectric material 125 is then patterned by performing an anisotropic dry etch process, such as ME, to etch down the conformal layer of dielectric material in a vertical direction. This etch process is performed selective to the semiconductor materials of the nanosheet stack structure 110. The etch process results in the formation of the gate sidewall spacers 120, which surround the sidewall surfaces of the dummy gate electrode 121 and the gate capping layer 123, as shown in FIG. 4. The gate sidewall spacers 120 define the gate region 118 of the nanosheet FET device 102. In one embodiment, the thickness of the gate sidewall spacers 120 is in a range of about 3 nm to about 4 nm, although the gate sidewall spacers 120 can be formed with other thickness ranges.

At some point in the vertical etch process to form the gate sidewall spacers 120, the portions of the conformal layer of dielectric material 125 on the lateral surfaces of the semiconductor device structure (e.g., on the upper surface of the gate capping layer 123 and the upper surface of the nanosheet stack structure 110) will be fully etched away, exposing the gate capping layer 123 and the upper surface of the nanosheet stack structure 110.

After forming the gate sidewall spacers 120, an anisotropic dry etch process (e.g., RIE) is performed to etch down the exposed portions of the nanosheet stack structure 110 in the source/drain regions adjacent to the gate structure 118 down to the upper surface of the semiconductor substrate 101. This etch process results in forming the nanosheet stack structure 110 of the nanosheet FET devices 102 in the gate structure 118. The etching of the exposed portions of the nanosheet stack structure 110 is selective to the gate sidewall spacers 120 and gate capping layer 123.

Figure 5:
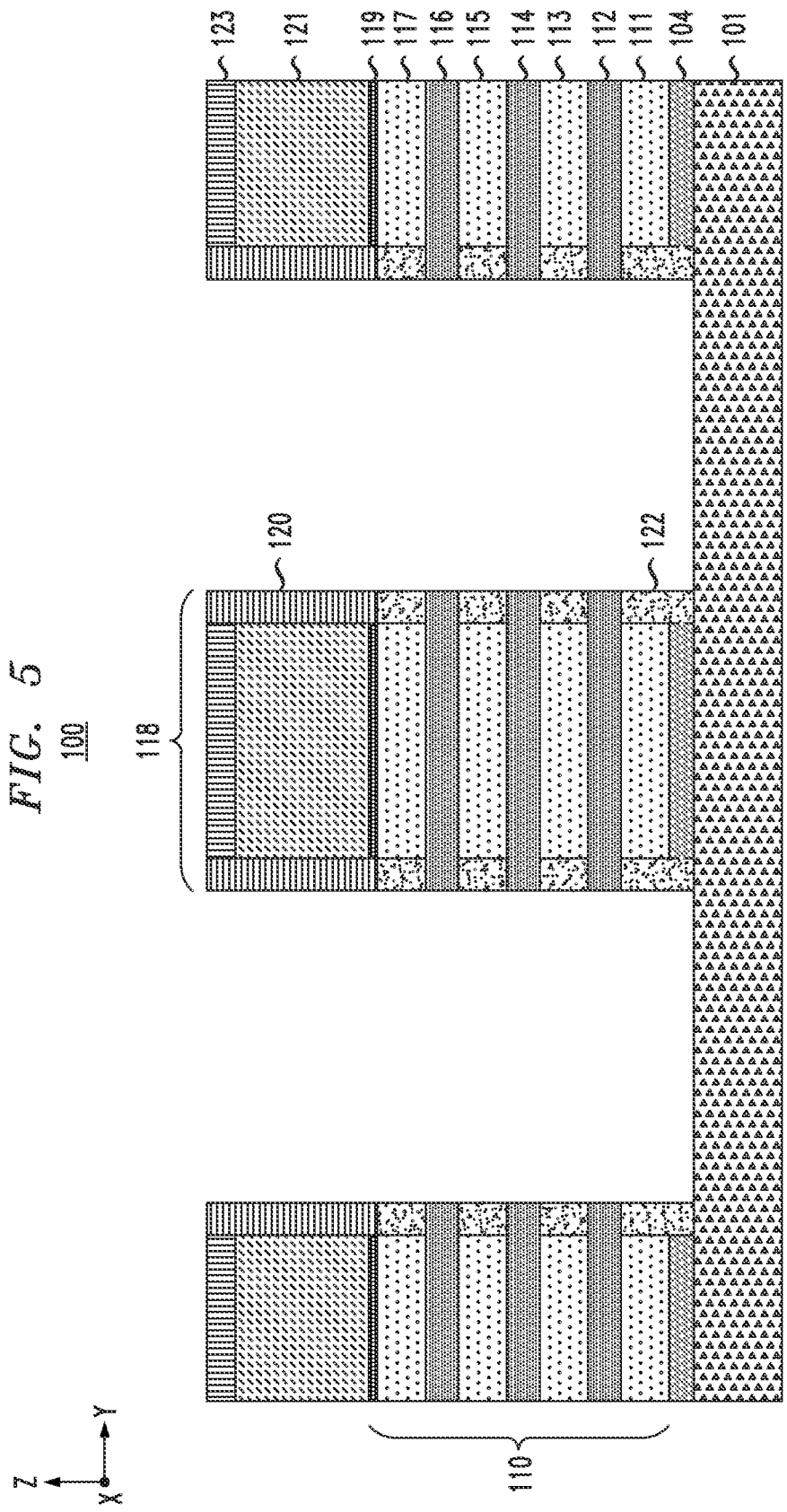
FIG. 5 is a schematic cross-sectional side view of the semiconductor device structure of FIG. 4 after forming the inner spacers for the gate structure, according to an embodiment of the invention.

Next, FIG. 5 is a schematic cross-sectional side view of the semiconductor device structure shown in FIG. 4 after forming the inner spacers 122 for the gate structure 118. In one embodiment, the inner spacers 122 are formed by a process which comprises laterally recessing exposed sidewall surfaces of sacrificial nanosheet layers 111, 113, 115, and 117 of the nanosheet stack structure 110 to form recesses in the sidewalls of the nanosheet stack structure 110. As shown in FIG. 5, the exposed sidewall surfaces of the sacrificial nanosheet layers 111, 113, 115, and 117 of the nanosheet stack structure 110 are laterally recessed to a pre-determined depth (in the Y-direction). The amount of lateral recess is controlled through a timed etch. In one embodiment, the depth of the recess is substantially equal to the thickness of the gate sidewall spacers 120.

In one embodiment of the invention, the lateral etch process can be performed using an isotropic wet etch process with an etch solution that is suitable to etch the semiconductor material (e.g., SiGe) of the sacrificial nanosheet layers 111, 113, 115, and 117 of the nanosheet stack structure 110 selective to the semiconductor material (e.g., Si) of the nanosheet channel layers 112, 114, and 116 and other exposed elements. In another embodiment, an isotropic dry plasma etch process can be performed to laterally etch the exposed sidewall surfaces of the sacrificial nanosheet layers 111, 113, 115, and 117 selective to the nanosheet channel layers 112, 114, and 116 and other exposed elements.

The recesses are then filled with dielectric material to form the inner spacers 122 (or embedded spacers) on the sidewalls of the nanosheet stack structure 110. In one embodiment, the inner spacers 122 are formed by depositing a conformal layer of dielectric material over the semiconductor device structure until the recesses are filled with dielectric material, followed by an etch back to remove the excess dielectric material. In one embodiment, the inner spacers 122 are formed of the same dielectric material used to form the gate sidewall spacers 120. For example, the inner spacers 122 can be formed of SiN, SiBCN, SiCON, or any other type of dielectric material (e.g., a low-k dielectric material having a k of less than 5) which is commonly used to form insulating gate sidewall spacers of FET devices. In one embodiment, the dielectric material is conformally deposited using a highly conformal deposition process, such as ALD, to ensure that the recesses are sufficiently filled with dielectric material. Other deposition methods such as CVD and PVD can be utilized to deposit a highly conformal layer of dielectric material to fill the recesses. The conformal layer of dielectric material can be etched back using an isotropic wet etch process to remove the excess dielectric material on the sidewalls of the nanosheet stack structure 110 and expose the sidewalls of the nanosheet channel layers 112, 114, and 116 while leaving the dielectric material in the recesses to form the inner spacers 122. The wet etch process may include, but is not limited to, buffered hydrofluoric acid (BHF), diluted hydrofluoric acid (DHF), hydrofluoric nitric acid (HNA), phosphoric acid, HF diluted by ethylene glycol (HF/EG), hydrochloric acid (HCl), or any combination thereof.

Figure 6:
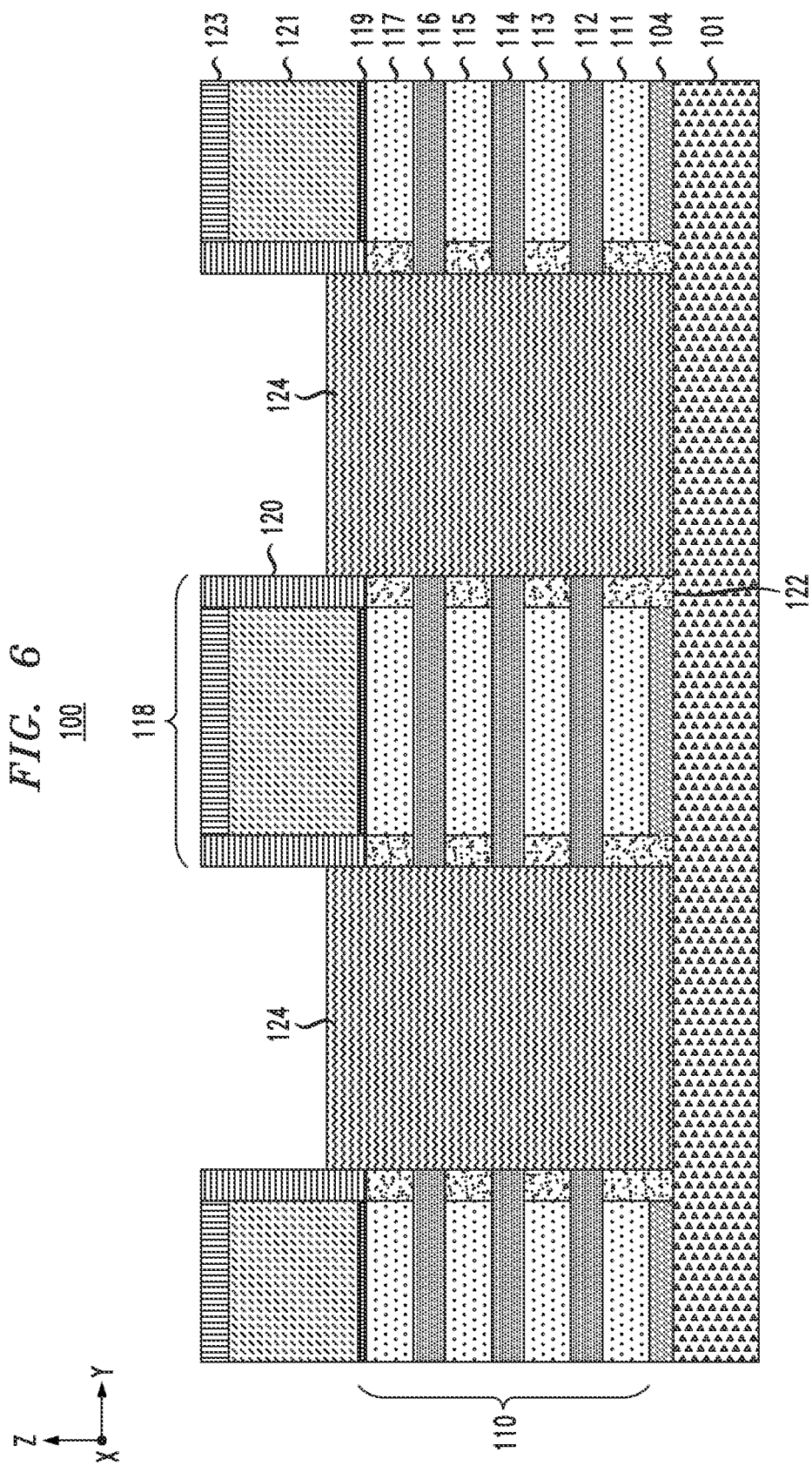
FIG. 6 is a schematic cross-sectional side view of the semiconductor device structure of FIG. 5 after forming the source/drain regions for the gate structure, according to an embodiment of the invention.

Next, FIG. 6 is a schematic cross-sectional side view of the semiconductor device structure shown in FIG. 5 after forming the source/drain regions 124 for the gate structure 118. The source/drain regions 124 of the nanosheet FET device 102 are formed by epitaxially growing semiconductor material (e.g., epitaxial Si material or SiGe material) on the exposed sidewall surfaces of the nanosheet channel layers 112, 114, and 116 using known techniques such as CVD, MOCVD, LPCVD, MBE, VPE, or other known epitaxial growth techniques which are suitable for the given process flow. In some embodiments, the source/drain regions 124 may also be formed by epitaxially growing semiconductor material on the exposed surface of semiconductor substrate 101. The type of epitaxial semiconductor material that is used to form the source/drain regions 124 will vary depending on various factors including, but not limited to, the type of material of the nanosheet channel layers 112, 114, and 116, the device type (e.g., n-type or p-type) of the nanosheet FET device 102, etc. In some embodiments, the source/drain regions 124 are epitaxially grown such that they overlap (in the X-Y plane) with at least a portion of the gate sidewall spacers 120. For example, the source/drain regions 124 may be epitaxially grown to a level above the top most inner spacer 122, as shown in FIG. 6.

The epitaxial growth of the semiconductor material on the exposed sidewall surfaces of the nanosheet channel layers 112, 114, and 116 and the exposed surface of semiconductor substrate 101 is performed so that the epitaxial material merges to form the source/drain regions 124 on the vertical sidewalls of the nanosheet stack structure 110, as schematically shown in FIG. 6. Furthermore, in one embodiment, the source/drain regions 124 are doped using known techniques. For example, in one embodiment, the source/drain regions 124 are "in-situ" doped during epitaxial growth by adding a dopant gas to the source deposition gas (i.e., the Si-containing gas). Exemplary dopant gases may include a boron-containing gas such as $BH_3$ for pFETs or a phosphorus or arsenic containing gas such as $PH_3$ or $AsH_3$ for nFETs, wherein the concentration of impurity in the gas phase determines its concentration in the epitaxially grown semiconductor material. Although not specifically shown in FIG. 6, in some embodiments, prior to forming the source/drain regions 124, an isolation layer can be formed on the exposed surface of the semiconductor substrate 101 to provide isolation between the semiconductor substrate 101 and the source/drain regions 124 of the nanosheet FET device 102.

In addition, in one embodiment of the invention, a thermal anneal process is performed following the epitaxial growth of the doping of source/drain regions 124 to cause dopants to be injected into the end portions of the nanosheet channel layers 112, 114, and 116 that are in contact with the epitaxial semiconductor material of the source/drain regions 124. This process effectively results in extending the source/drain regions 124 into the semiconductor material of the end portions of the nanosheet channel layers 112, 114, and 116 of the nanosheet stack structure 110.

Figure 7:
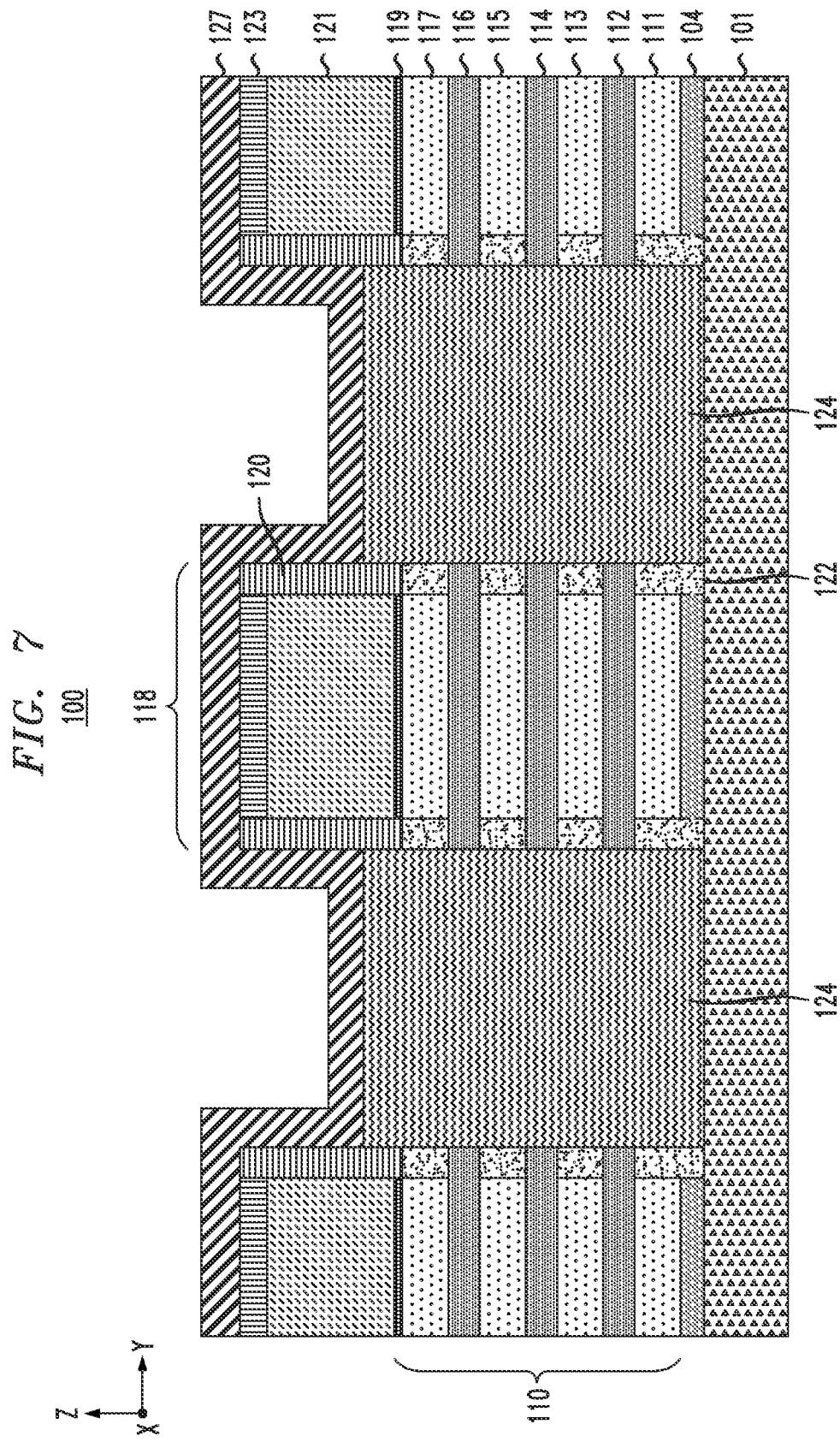
FIG. 7 is a schematic cross-sectional side view of the semiconductor device structure of FIG. 6 after forming a sacrificial layer over the source/drain regions, gate sidewall spacers, and gate capping layer, according to an embodiment of the invention.

Next, FIG. 7 is a schematic cross-sectional side view of the semiconductor device structure shown in FIG. 6 after forming a sacrificial layer 127 over the source/drain regions 124, gate sidewall spacers 120, and gate capping layer 123. The sacrificial layer 127 is formed by depositing a conformal layer of dielectric material over the entire surface of the semiconductor device structure. The conformal layer of dielectric material forming the sacrificial layer 127 can be formed of SiN, SiCN, SiON, BN, SiBN, SiBCN, SiOCN, or any other type of dielectric material that is commonly used to form a sacrificial layer during fabrication of FET devices, and deposited using known techniques such as atomic layer deposition (ALD), CVD and PVD. In some embodiments, the conformal layer of dielectric material that is used to form the sacrificial layer 127 is chosen to have etch selectivity to the material of the gate sidewall spacers 120. In one embodiment, the sacrificial layer 127 is formed with a thickness equal to or greater than the thickness of the gate sidewall spacers 120. In one embodiment, the thickness of the sacrificial layer 127 is in a range of about 3 nm to about 8 nm, although the sacrificial layer 127 can be formed with other thickness ranges.

Figure 8:
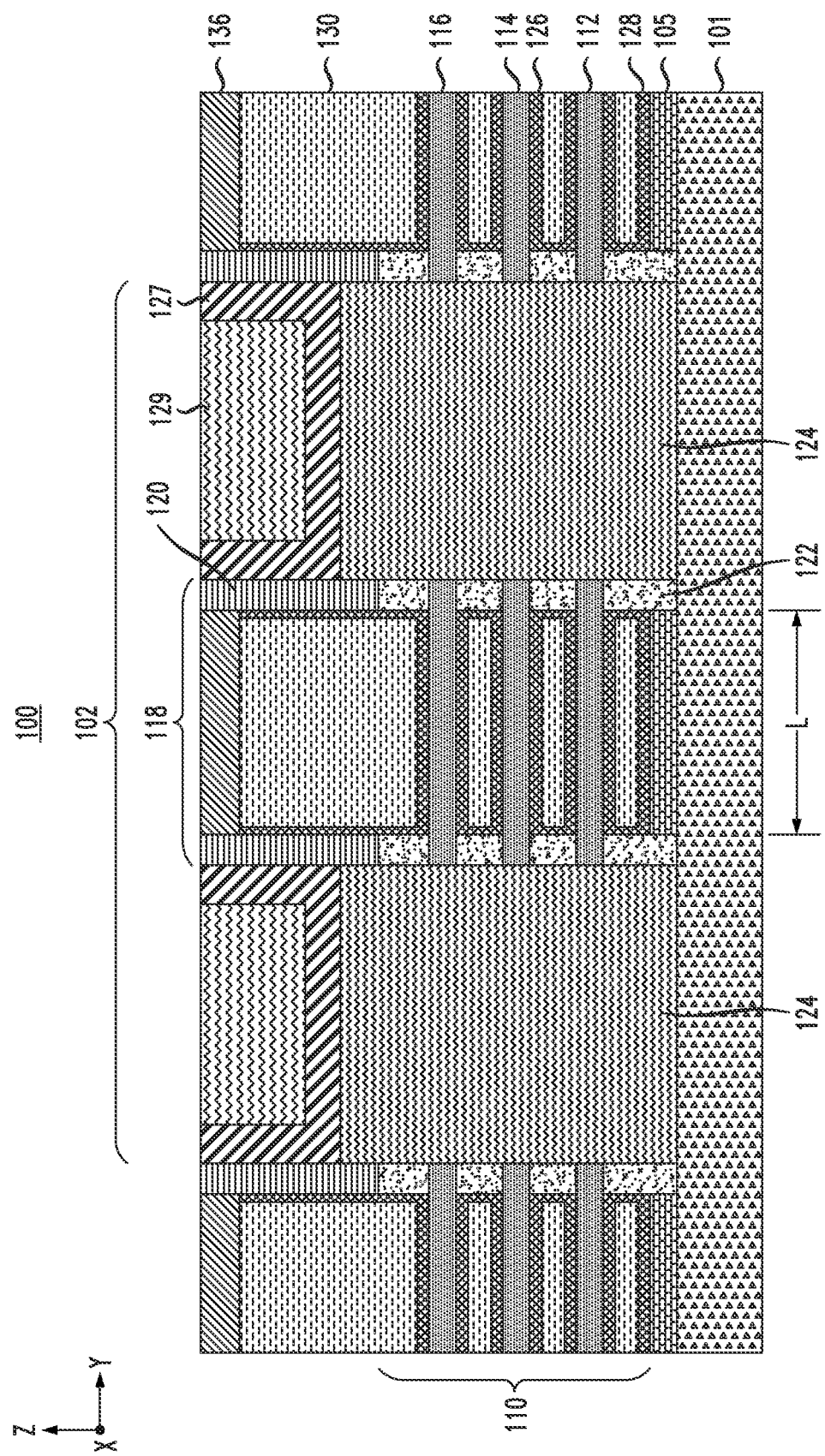
FIG. 8 is a schematic cross-sectional side view of the semiconductor device structure of FIG. 7 after formation of an inter-layer dielectric (ILD) and after a replacement metal gate process has been performed to replace the sacrificial dummy gate material with a metal gate structure, according to an embodiment of the invention.

Next, FIG. 8 is a schematic cross-sectional side view of the semiconductor device structure shown in FIG. 7 after formation of an inter-layer dielectric (ILD) and after a replacement metal gate process has been performed to replace the sacrificial dummy gate material with a metal gate structure. The inter-layer dielectric (ILD) layer 129 is formed over the sacrificial layer 127. The replacement metal gate process may include, for example, removing a portion of the ILD layer 129 and sacrificial layer 127 to expose the gate capping layer 123, removing gate capping layer 123, removing the sacrificial dummy gate material (dummy oxide layer 119 and dummy gate electrode layer 121) of the gate structure 118 to form an open gate region, removing the sacrificial nanosheet layers 111, 113, 115, and 117 exposed within the open gate region to release the nanosheet channel layers 112, 114 and 116 of the nanosheet stack structure 110, forming interfacial oxide layers 126 on exposed silicon surfaces of the nanosheet channel layers 112, 114, and 116, replacing spacer layer 104 with an oxide dielectric layer 105, forming thin, conformal high-k gate dielectric layers 128 on exposed surfaces within the open gate region, filling the open gate region with a work function metal 130, and forming a gate cap dielectric layer 136 over the work function metal 130 and gate sidewall spacers 120.

In one embodiment, the ILD layer 129 is formed by depositing a blanket layer of dielectric/insulating material over the semiconductor device structure and planarizing the layer of dielectric/insulating material and the sacrificial layer 127 down to the gate capping layer 123 to form the ILD layer 129, as shown schematically shown in FIG. 8. The ILD layer 129 may comprise any suitable insulating/dielectric material that is commonly utilized in semiconductor process technologies including, but not limited to, silicon oxide, silicon nitride, silicon oxynitride, SiCOH, SiCH, SiCNH, or other types of silicon-based low-k dielectrics (e.g., k less than about 4.0), porous dielectrics, known ULK (ultra-low-k) dielectric materials (with k less than about 2.5), or any suitable combination of those materials. The dielectric/insulating material of the ILD layer 129 is deposited using known deposition techniques, such as, for example, ALD, CVD, PECVD, PVD, or spin-on deposition. In one embodiment, the layer of dielectric/insulating material of the ILD layer 129 is planarized using a standard planarization process such as CMP to remove the overburden dielectric/insulating material that formed on sacrificial layer 127 over dummy gate capping layer 123. In some embodiments, the planarizing of the ILD layer 129 may also planarize a portion of the material of sacrificial layer 127 down to the upper surface of the dummy gate capping layer 123. In some embodiments, the ILD layer 129 comprises a silicon nitride liner on the surfaces of the dummy gate, spacers, source/drain, and sacrificial layer with silicon oxide filling the remaining space.

In one embodiment, the dummy gate capping layer 123 can be removed by planarizing (e.g., via CMP) the surface of the semiconductor device structure of FIG. 7 down to the upper surface of the dummy gate electrode layer 121. Such planarizing may also planarize sacrificial layer 127 and ILD layer 129 down to the upper surface of the dummy gate electrode layer 121. In another embodiment, the dielectric material of the dummy gate capping layer 123 (e.g., SiN) can be etched away selective to the materials of one or more of the gate sidewall spacers 120 (e.g., SiBCN), the sacrificial layer 127, and the ILD layer 129 (e.g., silicon oxide) to expose the underlying dummy gate electrode layer 121. In some embodiments, for example, the dummy gate capping layer 123 may be etched selective to the materials of the gate sidewall spacers 120, sacrificial layer 127 and ILD layer 129 in one or more etch processes.

The dummy gate electrode layer 121 (e.g., polysilicon material) is then etched away using known etching techniques and etch chemistries. For example, the sacrificial dummy gate polysilicon material can be removed using a selective dry etch or wet etch process with suitable etch chemistries, including ammonium hydroxide ($NH_4OH$), tetramethylammonium hydroxide (TMAH), or SF6 plasma.

The etching of the dummy gate electrode layer 121 is selective to, e.g., the underlying dummy gate oxide layer 119, to thereby protect the semiconductor materials of the nanosheet stack structure 110 from being etched during the poly etch process. The etching of the dummy gate electrode layer 121 is also selective to the sacrificial layer 127 and ILD layer 129. After removing the sacrificial material of the dummy gate electrode layer 121, an oxide etch process is performed to etch away the dummy gate oxide layer 119 selective to, e.g., the nanosheet channel layers 112, 114, and 116. In this manner, the sacrificial materials (e.g., dummy polysilicon and oxide layers) of the dummy gate can be etched away without damaging the nanosheet channel layers 112, 114, and 116.

After removing the dummy gate oxide layer 119, an etch process is performed to selectively etch away the sacrificial nanosheet layers 111, 113, 115, and 117 of the nanosheet stack structure 110 to release the nanosheet channel layers 112, 114, and 116, thereby allowing the open gate region to extend into spaces between and adjacent to the nanosheet channel layers 112, 114, and 116. In this embodiment, the open gate region includes the open spaces within the inner region defined by the gate sidewall spacers 120 and the inner spacers 122.

The sacrificial nanosheet layers 111, 113, 115, and 117 (e.g., SiGe layers) can be etched away selective to the nanosheet channel layers 112, 114, and 116 (Si layers) using a wet etch process, for example. In one embodiment, the SiGe material of the sacrificial nanosheet layers 111, 113, 115, and 117 can be selectively etched (with high etch selectivity) using a gas phase HCl (hydrochloric acid) or wet etch solution to laterally etch the SiGe material of the sacrificial nanosheet layers 111, 113, 115, and 117 selective to the Si material of the nanosheet channel layers 112, 114, and 116. The gas phase HCl (hydrochloric acid) provides high etch selectivity when, for example, the nanosheet channel layers 112, 114, and 116 are formed of Si or SiGe with a lower Ge concentration than the SiGe material of the sacrificial nanosheet layers 111, 113, 115, and 117.

In some embodiments, the spacer layer 104 may also be etched away as part of the etching process used to selectively etch the sacrificial nanosheet layers 111, 113, 115, and 117. In some embodiments, a separate etching process may be performed to etch away the spacer layer 104 selective to the nanosheet channel layers 112, 114, and 116 and semiconductor substrate 101.

As is known in the art, the use of high-k gate dielectric materials is problematic in that such dielectric materials typically do not interface well with silicon layers. For example, high-k gate dielectric materials do not passivate a silicon surface, which results in a large number of interface traps and charges and other issues which can degrade device performance.

As such, in one exemplary embodiment as discussed herein, before depositing high-k dielectric material to form the high-k gate dielectric layers, a channel pre-clean process is performed to clean the exposed silicon surfaces of the nanosheet channel layers 112, 114 and, which is then followed by a thermal oxidation process to grow the thin interfacial silicon oxide layers 126 on the exposed surfaces of the nanosheet channel layers 112, 114 and 116 within the open gate region, as schematically shown in FIG. 8. It is to be understood that the formation of the interfacial silicon oxide layers 126 is an optional step and that in other embodiments of the invention, a high-k dielectric material of the HKMG structures can be formed on the exposed silicon surfaces of the nanosheet channel layers 112, 114, and 116 without initially forming the thin interfacial oxide layers 126.

In one exemplary embodiment, the interfacial silicon oxide layers 126 are formed using a chemical oxidation process in ozonated deionized water comprising ozone, and a suitable oxidation temperature, ozone concentration in the deionized water, and chemical oxidation process time to form thin interfacial silicon oxide layers 126. The interfacial layers 126 are formed by oxidizing the exposed silicon surfaces of the nanosheet channel layers 112, 114 and 116 to form the interfacial silicon oxide layers 126 with a thickness in a range of about 5 angstroms to about 10 angstroms (i.e., about 0.5 nm to about 1 nm). In this regard, the chemical oxidation on the exposed top and bottom surfaces of the nanosheet channel layers 112, 114 and 116 effectively results in a reduction of the thickness of the silicon channel material of the nanosheet channel layers 112, 114 and 116 in a range of about 1 nm to about 2 nm. For example, assuming the nanosheet channel layers 112, 114 and 116 are formed with a thickness of 7 nm and the interfacial layers 126 are formed with a thickness of 0.5 nm, the nanosheet channel layers 112, 114 and 116 will essentially have a reduced thickness of 6 nm.

In some embodiments, the chemical oxidation process also results in the formation of an oxide dielectric layer 105 on the exposed surface region of the semiconductor substrate 101 within the open gate region. In some embodiments, a separate oxidation process may be performed to form the oxide dielectric layer 105 on the semiconductor substrate 101. In some embodiments, for example, a high SiGe removal process may be performed prior to the recessing of the source/drain region after formation of the dummy gate structure to remove the spacer layer 104 followed by formation of the oxide dielectric layer 105 to replace the spacer layer 104.

In one embodiment, the thin, conformal high-k gate dielectric layers 128 are formed by depositing one or more conformal layers of gate dielectric material over the exposed surfaces within the open gate regions of the semiconductor device structure, which results in the formation of high-k gate dielectric layers on the surfaces of the nanosheet channel layers 112, 114, and 116, (as well as the bottom and sidewall surfaces of the open gate region). The gate dielectric layers 128 are formed of a high-k dielectric material having a dielectric constant (k) of about 3.9 or greater. Where interfacial silicon oxide layers 126 are formed on the nanosheet channel layers 112, 114, and 116, the gate dielectric layers 128 are formed on the exposed surfaces of the interfacial silicon oxide layers 126 instead of directly on the surfaces of the nanosheet channel layers 112, 114, and 116. In some embodiments, a gate dielectric layer 128 is also formed on the exposed surface of oxide dielectric layer 105.

For example, the gate dielectric material can include but is not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k dielectric material may further include dopants such as lanthanum and aluminum. In one embodiment of the invention, the conformal gate dielectric layers 128 are formed with a thickness in a range of about 0.5 nm to about 2.5 nm, which will vary depending on the target application. The conformal layer of gate dielectric material is deposited using known methods such as ALD, for example, which allows for high conformality of the gate dielectric material.

The layer of work function metal 130 may comprise one or more layers of metallic material, including, but not limited to, TiN, TaN, TiAlC, Zr, W, Hf, Ti, Al, Ru, Pa, TiAl, ZrAl, WAl, TaAl, HfAl, TiAlC, TaC, TiC, TaMgC, or types, compositions, or alloys of work function metals that are commonly used to obtain target work functions which are suitable for the type (e.g., n-type or p-type) of nanosheet FET device that is to be formed. The layer of work function metal 130 is deposited using known methods such as ALD, CVD, etc. In one embodiment, as shown in FIG. 8, the layer of work function metal 130 completely fills the gate regions including the spaces above and below the nanosheet channel layers 112, 114, and 116. Indeed, in this embodiment, as noted above, the thickness of the sacrificial nanosheet layers 111, 113, 115, and 117 is selected to be in a range of about 8 nm to about 10 nm. Assuming the high-k gate dielectric layers 128 are formed with a thickness of about 2 nm, a space of about 4 nm to about 6 nm remains above and below the nanosheet channel layers 112, 114, and 116 after formation of the high-k dielectric layers 128, wherein the remaining space is filled with the work function metal 130. This is sufficient for short-channel length nanosheet FET devices (where the channel length L is about 15 nm or less).

Following the deposition of the layer of work function metal 130, a planarization process (e.g., CMP) is performed to polish the surface of the semiconductor structure down to the upper surface of the sacrificial layer 127 and the ILD layer 129, thereby removing overburden material of the work function metal 130 on the surface of the sacrificial layer 127 and the ILD layer 129. After planarizing the semiconductor structure, an upper portion of the work function metal 130 is recessed by, for example, forming an etch mask over the semiconductor structure with an opening to expose the upper surface region of the gate structure 118, followed by a RIE process to recess the work functional metal 130 down to the upper surface of the gate sidewall spacers 120. The gate cap dielectric layer 136 can be formed by removing the etch mask and depositing a layer of dielectric material, such as silicon nitride, SiOCN, SiBCN, etc., over the semiconductor structure using a deposition process, including, but not limited to, PVD, CVD, PECVD, or any combination thereof. A CMP process can then be performed to remove the overburden dielectric material and planarize the surface of the semiconductor structure down to the upper surface of the sacrificial layer 127 and the ILD layer 129, resulting in the semiconductor structure shown in FIG. 8.

Figure 9:
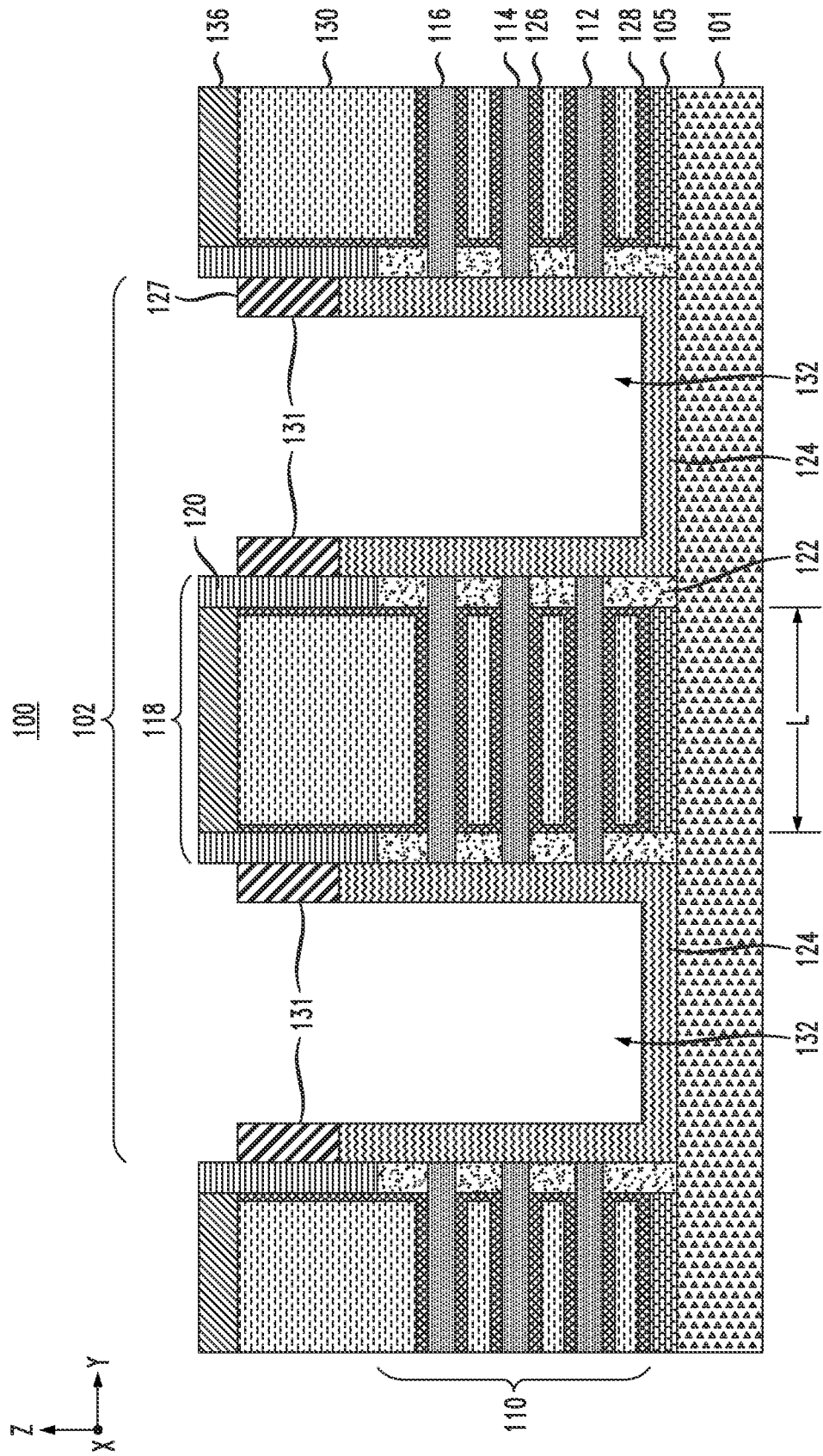
FIG. 9 is a schematic cross-sectional side view of the semiconductor device structure of FIG. 8 after the formation of trenches in the source/drain regions, according to an embodiment of the invention.

Next, FIG. 9 is a schematic cross-sectional side view of the semiconductor device structure shown in FIG. 8, after formation of the trenches 132 in the source/drain regions 124. Trenches 132 are formed using one or more etch processes such as those described above. For example, in some embodiments, a first etch process (e.g., RIE) is used to remove the ILD layer 129 selective to the sacrificial layer 127. In some embodiments, a second etch process (e.g., a RIE) is used to etch the sacrificial layer 127 enough to expose the source/drain regions 124 but not enough to remove sidewalls 131 of the sacrificial layer 127 which serve as a pattern mask for later etching of the source/drain regions 124. In some embodiments, the second etch process may be selective to the source/drain material of source/drain regions 124. In some embodiments, the second etch process need not be selective to the source/drain material as the source/drain material will be later etched by a third etch process. The third etch process (e.g., RIE) is used to form the trenches 132 in the source/drain regions 124 according to the pattern defined by the sidewalls 131 of the sacrificial layer 127. In some embodiments, the third etch process is selective to the second etch process such that the sidewalls 131 of the sacrificial layer 127 are not etched and act as a pattern mask for forming trenches 132 in source/drain regions 124.

In some embodiments, one or more of the etch processes may be combined. For example, in some embodiments, the first and second etch processes may be performed as a single etch process. In some embodiments, one or more of the etch processes may be a timed etch process where the time or number of cycles is controlled to obtain a desired depth into the material being etched. For example, the etching of trenches 132 into source/drain regions 124 by the third etch process may be timed or controlled such that at least some source/drain material remains disposed between the semiconductor substrate 101 and the source/drain regions 124 after etching is complete. It is important to note that trenches 132 do not expose nanosheet channel layers 112, 114, and 116. Instead, the material of source/drain regions 124 is disposed between the nanosheet channel layers 112, 114, and 116, and the trenches 132 according to the pattern mask defined by sidewalls 131 of sacrificial layer 127. In some embodiments, trenches 132 are formed to a depth equal to or greater than the depth of nanosheet channel layer 112.

Figure 10:
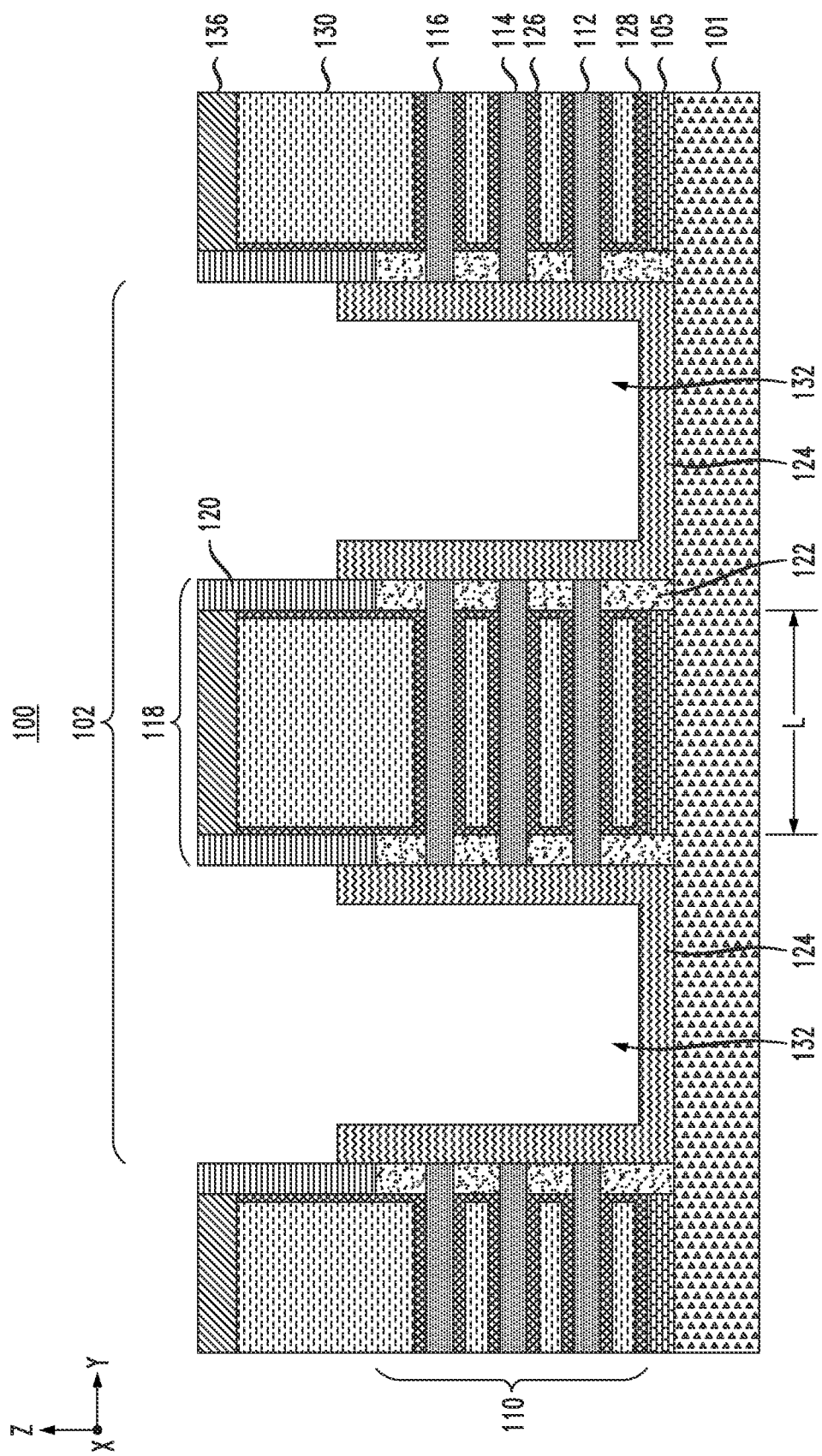
FIG. 10 is a schematic cross-sectional side view of the semiconductor device structure of FIG. 9 after removal of the remaining portions of the sacrificial layer, according to an embodiment of the invention.

Next, FIG. 10 is a schematic cross-sectional side view of the semiconductor device structure shown in FIG. 9 after removal of the remaining portions of sacrificial layer 127, e.g., sidewalls 131 and any other residual material of sacrificial layer 127 that may still be present. In some embodiments, the remaining portions of sacrificial layer 127 may be removed using one or more etching processes such as those described above. For example, in some embodiments a wet etching process is used to remove the remaining portions of sacrificial layer 127 selective to the material of source/drain regions 124, gate sidewall spacer 120, and gate cap dielectric layer 136. In some embodiments, for example, where sacrificial layer 127 is a silicon nitride, a phosphoric acid based wet etching process may be performed to remove any remaining portions of sacrificial layer 127 selective to the source/drain regions 124, gate sidewall spacer 120, and gate cap dielectric layer 136.

Figure 11:
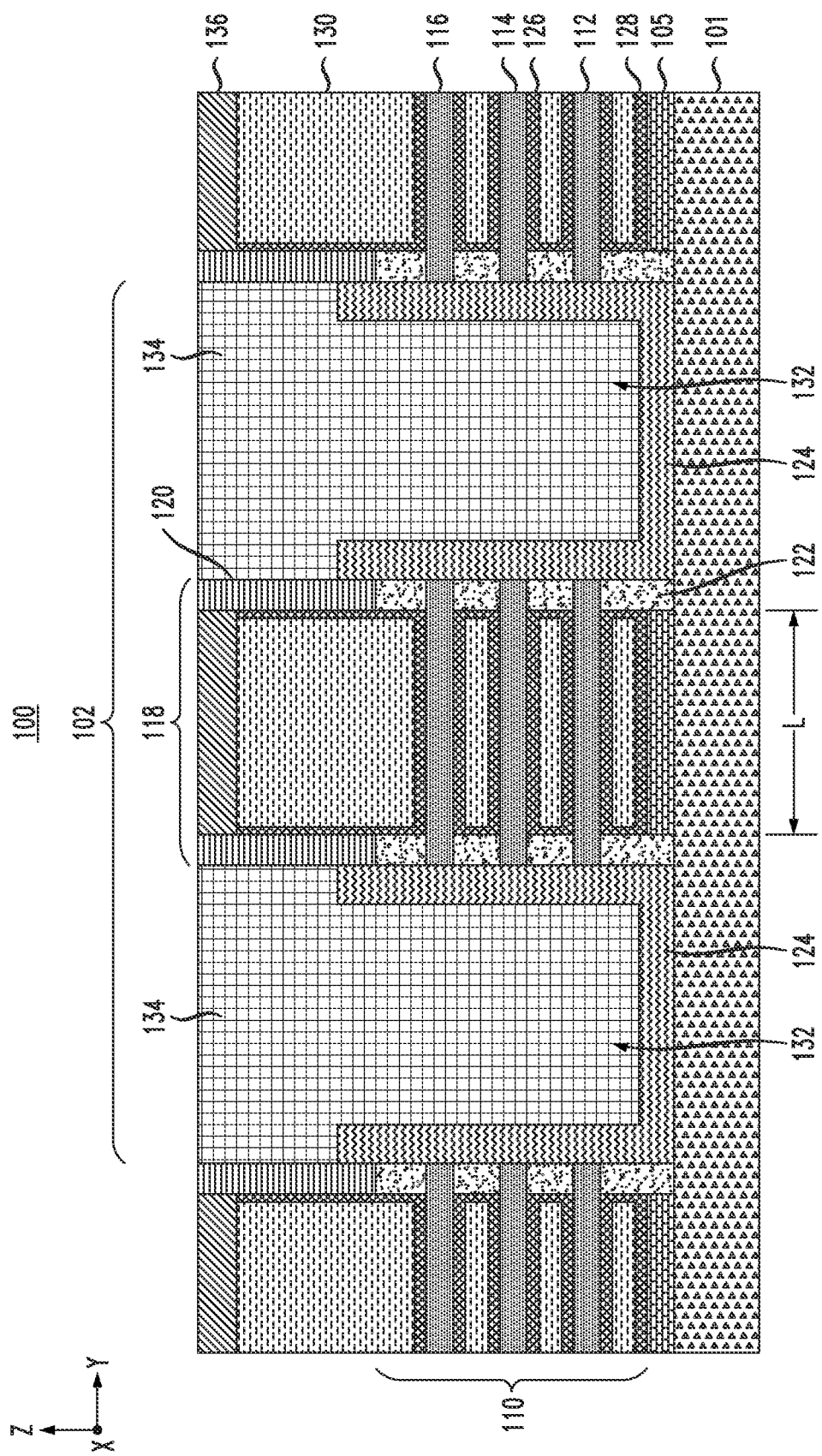
FIG. 11 is a schematic cross-sectional side view of the semiconductor device structure of FIG. 10 after formation of a source/drain contact material in the trenches, according to an embodiment of the invention.

Next, FIG. 11 is a schematic cross-sectional side view of the semiconductor device structure shown in FIG. 10 after formation of a source/drain contact material 134 in the trenches 132. In some embodiments, the source/drain contact material 134 is a metallic material. For example, source/drain contact material 134 may comprise a trench silicide or other metallic material that serves as a contact for the source/drain regions 124 of the semiconductor device 100. In some embodiments, the source/drain contact material 134 may be deposited using known deposition techniques, such as, for example, ALD, CVD, PECVD, PVD, or spin-on deposition.

In some embodiments a contact liner may optionally be deposited in the trenches 134 prior to the formation of the source/drain contact material 134, for example, using known deposition techniques, such as, for example, ALD, CVD, PECVD, PVD, or spin-on deposition. For example, the contact liner may comprise a TiNCo and II-V silicon material. In some embodiments, contact liner may comprise one or more of Ti, Ni, Pt, or other similar materials. In some embodiments, a seeding layer may be formed on the contact liner that comprises, for example, TiN, TaN, Ru, or other similar materials. In some embodiments, the source/drain contact material 134 may comprise W, Co, Ru, Cu, or other metallic material commonly used to form source/drain contacts.

Thereafter, any known sequence of processing steps can be performed to complete the fabrication of the semiconductor integrated circuit device, the details of which are not needed to understand embodiments of the invention. Briefly, by way of example, middle-of-the-line (MOL) processing can continue to form MOL contacts (e.g., gate contacts, source/drain contacts, etc.). Then, a back-end-of-line (BEOL) process module can be performed to fabricate a BEOL interconnect structure which provides connections to/between the MOL contacts, and other active or passive devices that are formed as part of the front-end-of-line (FEOL) layer.

As noted above, the resulting semiconductor device structure shown in FIGS. 1 and 2 comprises a nanosheet FET device 102 that mitigates the effect of overfilled source/drain regions 124 on external source/drain contact resistance through the use of trenches 132 in the source/drain regions 124 filled with the source/drain contact material 134. The trenches 132 ensure that the contact resistance of a nanosheet FET device 102 having overfilled source/drain regions 124 and the contact resistance of a nanosheet FET device 102 having a source/drain region 124 that is not overfilled will be similar since the thickness of the source/drain region 124 between the nanosheet channel layers 112, 114, and 116 and the source/drain contact material 134 will be approximately the same regardless of the overfill. In addition, by filling trenches 132 with source/drain contact material 134, the contact area of the source/drain contact material 134 relative to the nanosheet channel layers 112, 114 and 116 is increased over designs without trenches 132 which serves to reduce contact-resistance.

FIGS. 12-15 schematically illustrate a method for fabricating a semiconductor integrated circuit device 200 comprising nanosheet FET devices having channels in the source/drain regions filled with contact material, according to an embodiment of the invention. For brevity, the elements of semiconductor integrated circuit device 100 that are also present in semiconductor integrated circuit device 200 will be described with reference to the same reference numbers. The schematic cross-sectional side views of FIGS. 12-15 provide an alternate embodiment in which an oxide layer 138 is grown on the exposed portion of semiconductor substrate 101 prior to the epitaxial growth of the source/drain regions 124.

Figure 12:
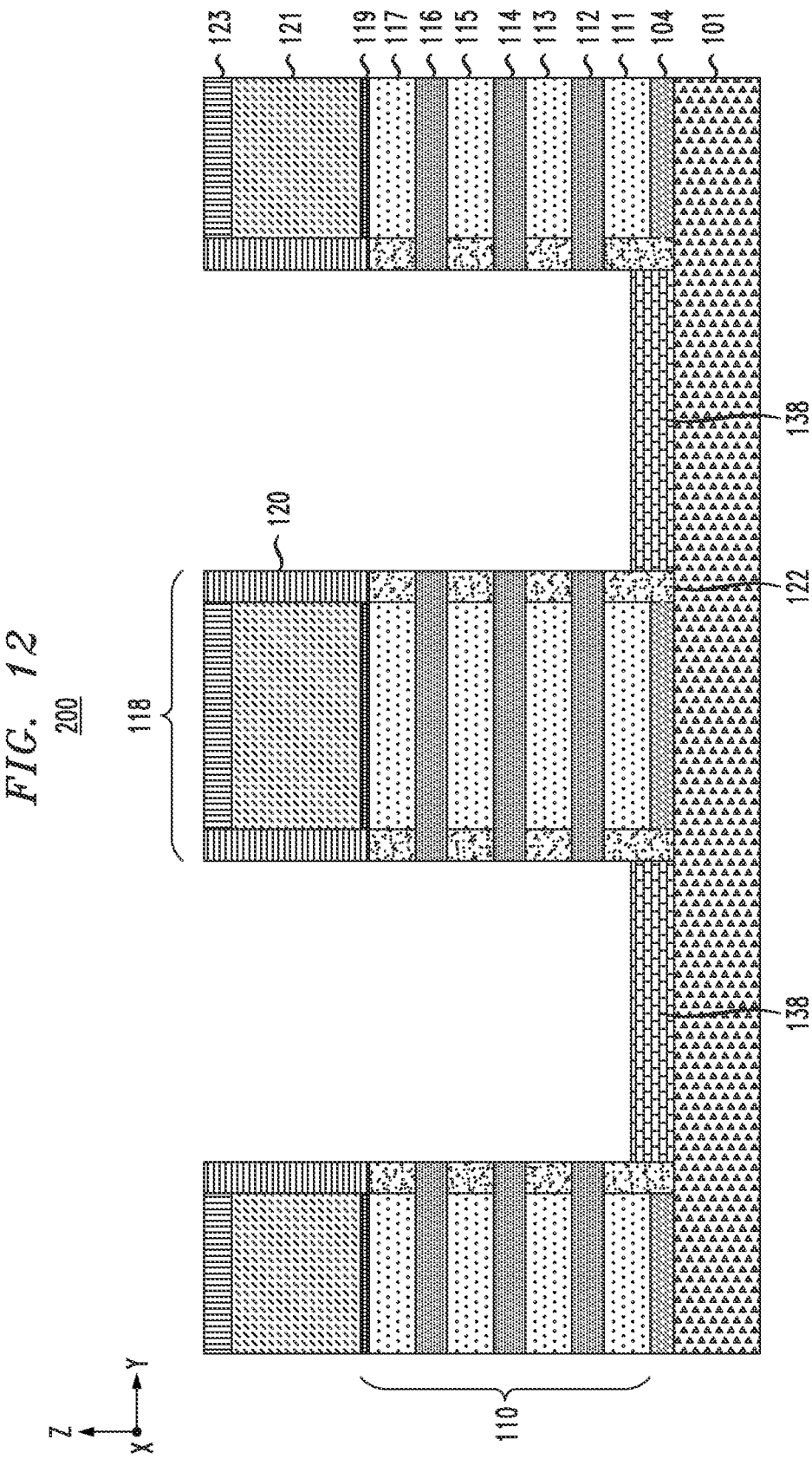
FIG. 12 is a schematic cross-sectional side view of the semiconductor device structure of FIG. 5 after forming oxide layers on the exposed upper surface of semiconductor substrate, according to an embodiment of the invention.
Figure 13:
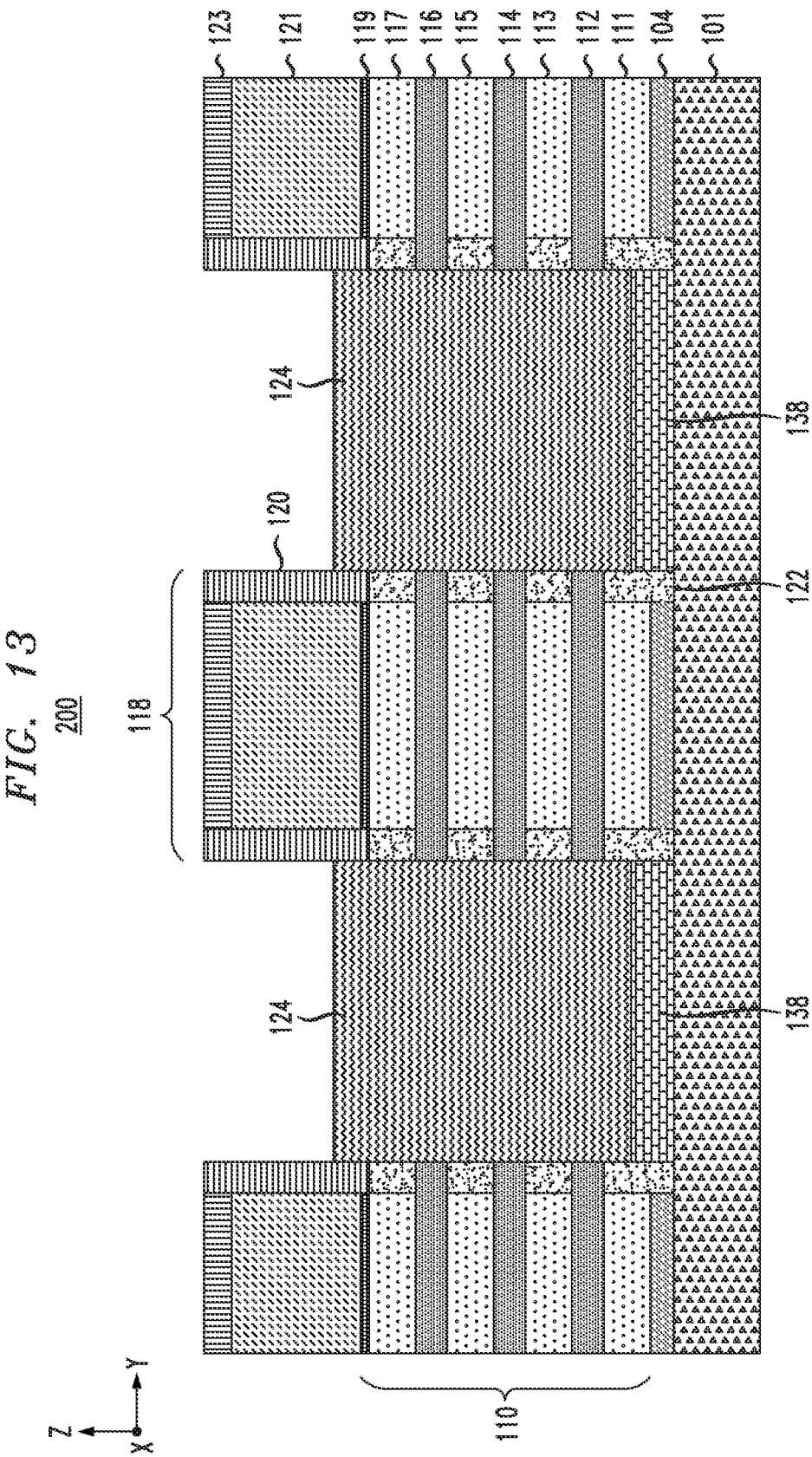
FIG. 13 is a schematic cross-sectional side view of the semiconductor device structure of FIG. 12 after forming the source/drain regions for the gate structure over the oxide layers, according to an embodiment of the invention.

FIG. 12 is a schematic cross-sectional side view of the semiconductor device structure shown in FIG. 5 after forming an oxide layer 138 on the exposed upper surface of semiconductor substrate 101 and prior to the epitaxial growth of source/drain regions 124 described with reference to FIG. 6. In an embodiment, a channel pre-clean process is performed to clean the exposed silicon surfaces of the semiconductor substrate 101 which is then followed by a thermal oxidation process to grow the oxide layer 138 on the exposed surfaces of the semiconductor substrate 101 within the source/drain region, as schematically shown in FIG. 12. In one embodiment, the thickness of the oxide layer 138 is in a range of about 3 nm to about 8 nm, although the oxide layer 138 can be formed with other thickness ranges. The oxide layer 138 ensures that the source/drain material of the source/drain regions 124 that is epitaxially grown, as described above with reference to FIG. 6, is grown on the oxide layer 138 and does not contact the semiconductor substrate 101, as shown, for example, with reference to FIG. 13.

Figure 14:
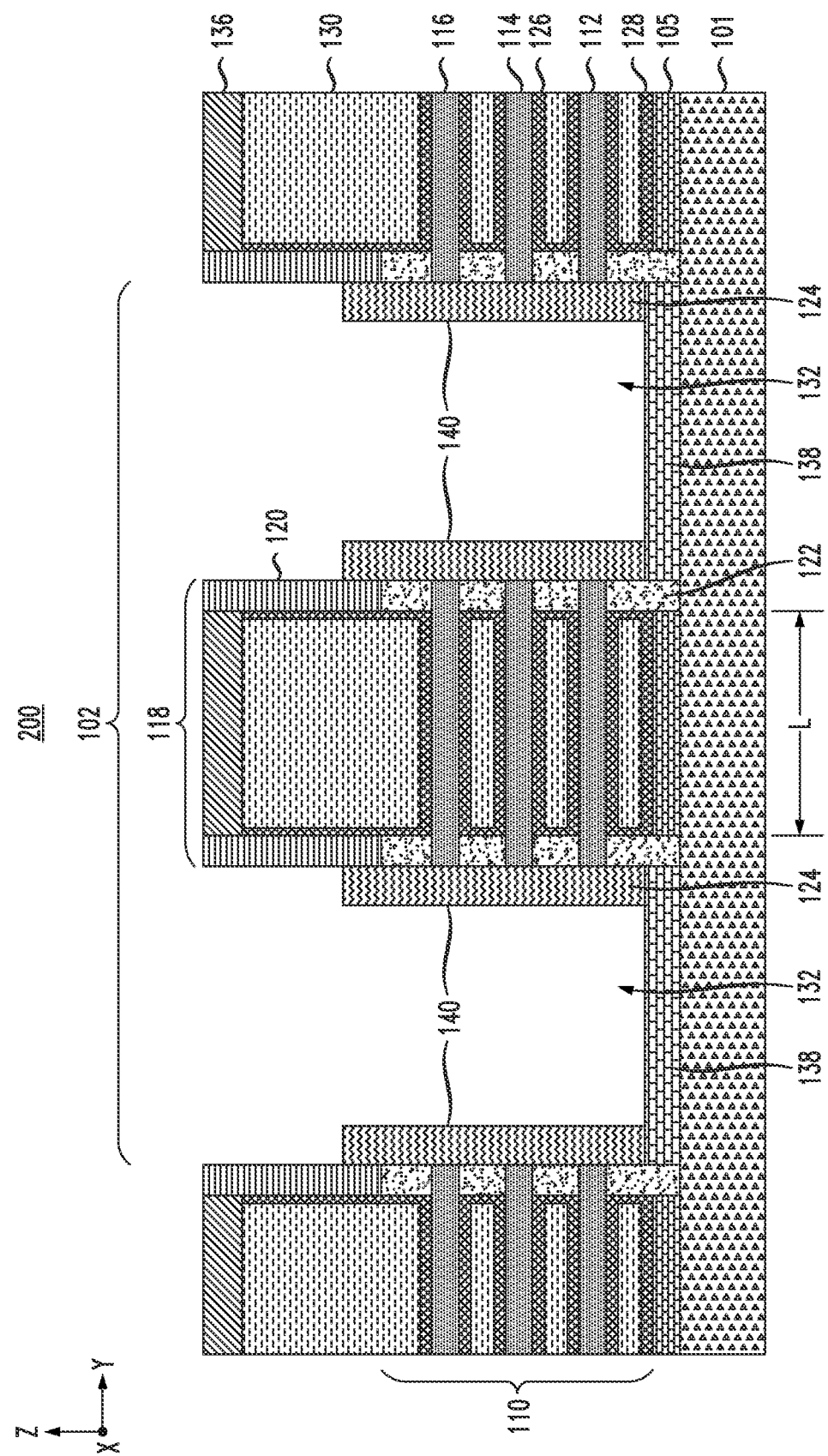
FIG. 14 is a schematic cross-sectional side view of the semiconductor device structure of FIG. 13 after forming a sacrificial layer over the source/drain regions, gate sidewall spacers, and gate capping layer, after formation of an inter-layer dielectric (ILD), after a replacement metal gate process has been performed to replace the sacrificial dummy gate material with a metal gate structure, and after the formation of trenches in the source/drain regions that extend to the oxide layers, according to an embodiment of the invention.

In this embodiment, during formation of trenches 132 as described above with reference to FIGS. 9 and 10, instead of etching the source/drain regions 124 such that a portion of the source/drain regions 124 remain between the trenches 132 and the semiconductor substrate 101, the source/drain regions 124 are etched to expose the oxide layer 138, as shown, for example, in FIG. 14, leaving sidewalls 140 of the source/drain regions 124 between the trenches 132 and the nanosheet channel layers 112, 114 and 116. In this embodiment, there is less need to tightly control the time or number of cycles of the etching of the source/drain regions 124 during formation of trenches 132 due to the presence of oxide layer 138 which leads to more uniform output of the fabrication process. For example, the oxide layer 138 protects the underlying semiconductor substrate 101 from any potential over etching of the source/drain regions 124 when forming trenches 132 and mitigates the chance of a junction leakage.

Figure 15:
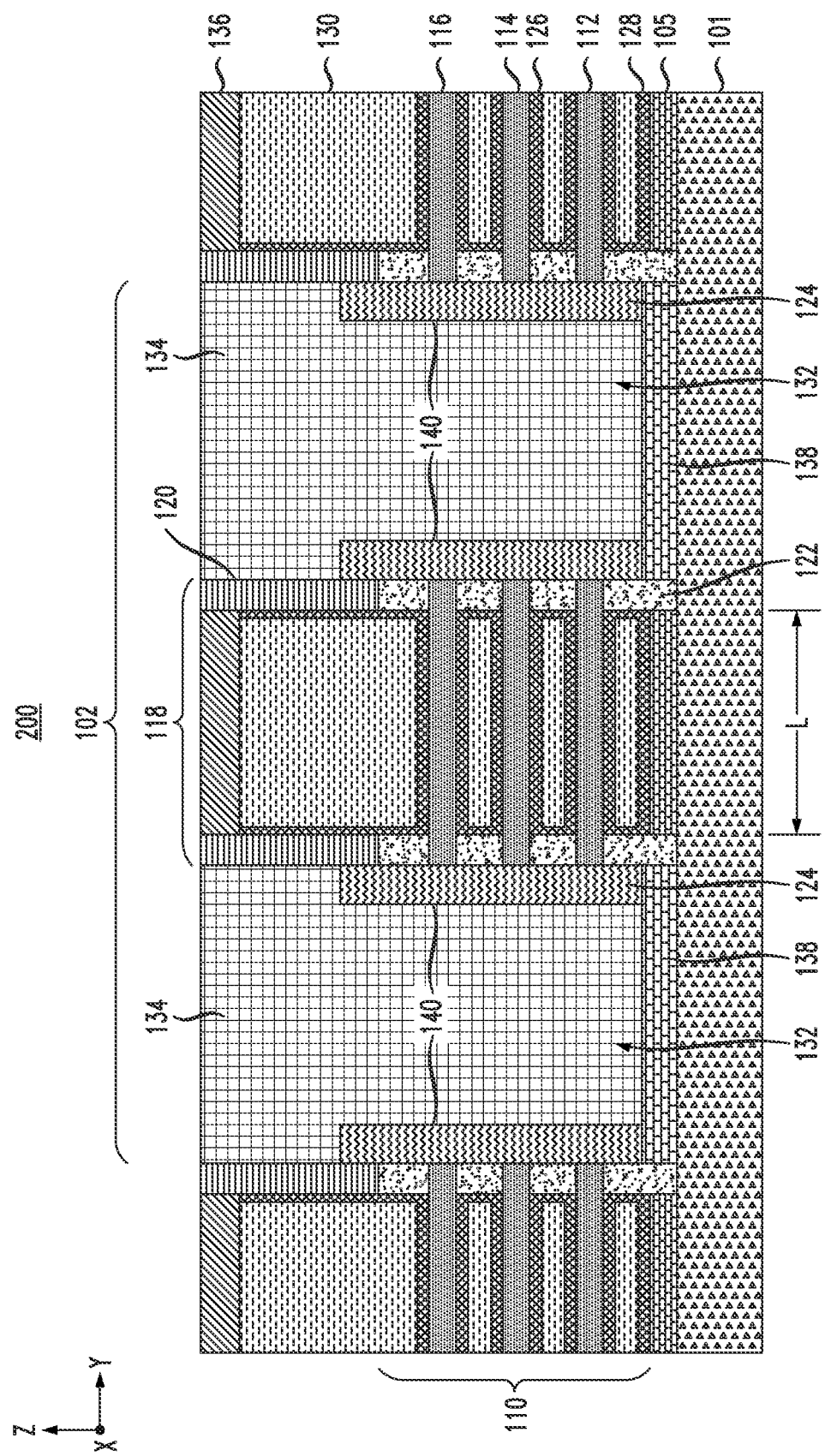
FIG. 15 is a schematic cross-sectional side view of the semiconductor device structure of FIG. 14 after forming the source/drain contact material within the trenches on the oxide layers, according to an embodiment of the invention.

During the process of forming the source/drain contact material 134, as described above with reference to FIG. 11, the source/drain contact material 134 is now formed within trench 132 on an upper surface of oxide layer 138 instead of only on the source/drain region 124, as shown in FIG. 15.

It is to be understood that the methods discussed herein for fabricating nanosheet FET devices with trenches in the source/drain regions filled with the source/drain contact material can be readily incorporated within semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

The invention claimed is:

1. A semiconductor device, comprising:
a nanosheet field-effect transistor device disposed on a semiconductor substrate, wherein the nano sheet field-effect transistor device comprises:
a plurality of nanosheet stack structures each comprising a plurality of semiconductor channel layers;
a gate structure on the nanosheet stack structures;
a gate sidewall spacer on the gate structure;
a source/drain region in contact with sidewalls of the nanosheet stack structures and on a portion of the gate sidewall spacer to define a trench between opposing sidewalls; and
a metal-based material disposed in the trench, on a top surface of the source/drain region and on the gate sidewall spacer;
wherein the source/drain region is disposed on the sidewalls of the nanosheet stack structures and on a portion of an oxide layer disposed over a portion of the semiconductor substrate;
wherein the source/drain region has a uniform thickness along the sidewalls of the nanosheet stack structures and on the portion of the gate sidewall spacer; and
wherein the trench extends through the source/drain region to the oxide layer.

2. The semiconductor device of claim 1, wherein the trench extends to a depth in the source/drain region at least equal to a depth of the semiconductor channel layers in the nanosheet stack structures.

3. The semiconductor device of claim 1, wherein the source/drain region is disposed on the sidewalls of the nanosheet stack structures and on a portion of the semiconductor substrate.

4. The semiconductor device of claim 1, wherein a top surface of the metal-based material is coplanar with a top surface of the gate structure.

5. The semiconductor device of claim 1, wherein the gate structure comprises a gate cap layer.

6. The semiconductor device of claim 1, wherein the metal-based material comprises a trench silicide.

7. An integrated circuit, comprising:
one or more semiconductor devices, wherein at least one of the semiconductor devices comprises:
a nanosheet field-effect transistor device disposed on a semiconductor substrate, wherein the nano sheet field-effect transistor device comprises:
a plurality of nanosheet stack structures each comprising a plurality of semiconductor channel layers;
a gate structure on the nanosheet stack structures;
a gate sidewall spacer on the gate structure;
a source/drain region in contact with sidewalls of the nanosheet stack structures and on a portion of the gate sidewall spacer to define a trench between opposing sidewalls; and
a metal-based material disposed in the trench, on a top surface of the source/drain region and on the gate sidewall spacer;
wherein the source/drain region is disposed on the sidewalls of the nanosheet stack structures and on a portion of an oxide layer disposed over a portion of the semiconductor substrate;
wherein the source/drain region has a uniform thickness along the sidewalls of the nanosheet stack structures and on the portion of the gate sidewall spacer; and
wherein the trench extends through the source/drain region to the oxide layer.

8. The integrated circuit of claim 7, wherein the trench extends to a depth in the source/drain region at least equal to a depth of the semiconductor channel layers in the nanosheet stack structures.

9. The integrated circuit of claim 7, wherein the source/drain region is disposed on the sidewalls of the nanosheet stack structures and on a portion of the semiconductor substrate.

10. The integrated circuit of claim 7, wherein a top surface of the metal-based material is coplanar with a top surface of the gate structure.

11. The integrated circuit of claim 7, wherein the gate structure comprises a gate cap layer.

12. The integrated circuit of claim 7, wherein the metal-based material comprises a trench silicide.

13. A semiconductor device, comprising:
a nanosheet field-effect transistor device disposed on a semiconductor substrate, wherein the nanosheet field-effect transistor device comprises:
a nanosheet stack structure comprising a semiconductor channel layer;
a source/drain region in contact with an end portion of the semiconductor channel layer of the nanosheet stack structure; and
a metal-based source/drain contact material disposed in a trench in the source/drain region;
wherein the source/drain region has a uniform thickness along the end portion of the semiconductor channel layer of the nanosheet stack structure;
wherein the source/drain region is disposed on the end portion of the semiconductor channel layer and on a portion of an oxide layer disposed over a portion of the semiconductor substrate; and
wherein the trench extends through the source/drain region to the oxide layer.

14. The semiconductor device of claim 13, further comprising a gate structure on the nanosheet stack structure.

15. The semiconductor device of claim 14, wherein the gate structure comprises a gate sidewall spacer, and the source/drain region is in contact with at least a portion of the gate sidewall spacer.

16. The semiconductor device of claim 15, wherein the metal-based source/drain contact material is disposed in the trench and on the gate sidewall spacer.

17. The semiconductor device of claim 14, wherein the gate structure comprises a gate cap layer.

18. The semiconductor device of claim 13, wherein the trench extends to a depth in the source/drain region at least equal to a depth of the semiconductor channel layer in the nanosheet stack structure.

19. The semiconductor device of claim 14, wherein a top surface of the metal-based source/drain contact material is coplanar with a top surface of the gate structure.

20. The semiconductor device of claim 13, wherein the metal-based source/drain contact material comprises a trench silicide.

* * * * *